(12) United States Patent
Marchant et al.

(10) Patent No.: US 7,449,354 B2
(45) Date of Patent: Nov. 11, 2008

(54) TRENCH-GATED FET FOR POWER DEVICE WITH ACTIVE GATE TRENCHES AND GATE RUNNER TRENCH UTILIZING ONE-MASK ETCH

(75) Inventors: Bruce Douglas Marchant, Murray, UT (US); Thomas E. Grebs, Mountain Top, PA (US); Rodney S. Ridley, Scarborough, ME (US); Nathan Lawrence Kraft, Pottsville, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 477 days.

(21) Appl. No.: 11/327,657

(22) Filed: Jan. 5, 2006

(65) Prior Publication Data

US 2007/0155104 A1    Jul. 5, 2007

(51) Int. Cl.
*H01L 21/00* (2006.01)

(52) U.S. Cl. .............................. 438/39; 438/40; 438/42; 438/43; 438/128; 438/259; 438/270; 438/942; 438/FOR. 100; 438/FOR. 208; 438/FOR. 240; 257/E29.201; 257/E29.257; 257/E29.26

(58) Field of Classification Search ................... 438/39, 438/40, 42, 43, 128, 259, 270, 942, FOR. 100, 438/FOR. 208, FOR. 240; 257/E29.201, 257/E29.257, E29.26

See application file for complete search history.

(56) References Cited

U.S. PATENT DOCUMENTS

| 3,257,626 | A | * | 6/1966 | Marinace et al. | ............ | 372/50.1 |
| 3,900,863 | A | * | 8/1975 | Kim | ............................ | 257/95 |
| 5,814,858 | A | * | 9/1998 | Williams | ..................... | 257/328 |
| 6,316,280 | B1 | * | 11/2001 | Fujiwara | ....................... | 438/31 |
| 6,384,955 | B2 | * | 5/2002 | Tada et al. | ................... | 359/248 |
| 6,548,317 | B2 | * | 4/2003 | Taniguchi et al. | .............. | 438/25 |
| 6,653,161 | B1 | * | 11/2003 | Morse | .......................... | 438/31 |
| 6,673,680 | B2 |  | 1/2004 | Calafut |  |  |
| 6,690,062 | B2 |  | 2/2004 | Henninger et al. |  |  |
| 6,838,722 | B2 |  | 1/2005 | Bhalla et al. |  |  |
| 6,861,701 | B2 |  | 3/2005 | Williams et al. |  |  |
| 2005/0161735 | A1 | * | 7/2005 | Aoki et al. | ................... | 257/330 |
| 2005/0167742 | A1 |  | 8/2005 | Challa et al. |  |  |

* cited by examiner

*Primary Examiner*—Thanh V Pham
(74) *Attorney, Agent, or Firm*—Townsend and Townsend and Crew LLP

(57) ABSTRACT

A trench-gated field effect transistor (FET) is formed as follows. Using one mask, a plurality of active gate trenches and at least one gate runner trench are defined and simultaneously formed in a silicon region such that (i) the at least one gate runner trench has a width greater than a width of each of the plurality of active gate trenches, and (ii) the plurality of active gate trenches are contiguous with the at least one gate runner trench.

39 Claims, 19 Drawing Sheets

TRENCH-GATED FET FOR POWER DEVICE WITH ACTIVE GATE TRENCHES AND GATE RUNNER TRENCH UTILIZING ONE-MASK ETCH

CROSS-REFERENCE TO RELATED APPLICATIONS

This application is related to the commonly assigned U.S. application Ser. No. 11/026,276, filed Dec. 29, 2004 which disclosure is incorporated herein by reference in its entirety for all purposes.

BACKGROUND OF THE INVENTION

The present invention relates to semiconductor power device technology and more particularly to improved trench-gated power devices and manufacturing processes for forming the same.

Power MOSFETs (metal oxide semiconductor field effect transistors) are well known in the semiconductor industry. One variety of power MOSFETs is the vertically-conducting "trench MOSFET" (e.g., trench DMOS, trench FET, UMOS, etc.). Generally, the trench MOSFET includes vertical trenches formed in a semiconducting layer. The semiconducting layer is disposed on a substrate (i.e., wafer) that forms the trench MOSFET drain. Each trench includes a polysilicon gate insulated from the sidewalls of the trench by a dielectric, generally an oxide. Source regions of the MOSFET flank each side of trenches. Trench MOSFETs rely on current flow though a channel formed between the source regions and the drain region. The current flow is controlled by a potential placed on the polysilicon gates.

Conventionally, the polysilicon gate must be connected to the leads of the device package. To accomplish this, the gate extends out of the trench and up onto an insulating layer formed on the surface of the substrate. An overlying metal layer is then formed on the surface of the substrate to electrically connect the source mesa regions and the polysilicon gates on the surface to bonding pads or to bonding structures of the device. A dielectric layer is used to insulate the polysilicon gates in the trenches from the overlying metal layer. The overlying metal layer is masked and etched to separate the metal layer connecting the gates from the metal layer connecting the source regions. In a conventional configuration, the metal layer forms a bus for connecting the source regions and another bus connecting the gates.

Current fabrication processes used to fabricate trench-gated MOSFETs have proven challenging for the semiconductor industry. Generally, the more complex the device, the more complex the process steps. The more complex the process steps the more likely a process error will occur. For example, conventional processes for power MOSFETs often involve the creation and deployment of several masks to accommodate forming complex structures such as active gate trenches. Using multiple masks to etch adjacent trenches of varying dimensions has proven to be difficult due to errors introduced by the mask dimensions and/or alignment thereof at each masking step. A single mask misalignment can potentially ruin an entire array of MOSFETs.

Variations in the topography of the substrate surface make it difficult to uniformly deposit onto or etch material from the wafer surface. For example, variations in topography. make it difficult to bring the entire surface of the substrate in the depth of field of photolithography system, or selectively remove material based on position. Variations in semiconductor device fabrication often leads to variations in device electrical performance such as drain-to-source resistance (Rdson), drain to gate charge (Qgd), and the like. Therefore, providing a uniform substrate surface at various fabrication stages is essential in providing accurate electrical characteristics of power MOSFETs.

There is therefore a need for cost effective fabrication processes and substrate structures that minimize or eliminate device defects during the fabrication of vertically aligned trench gated MOSFETs while enhancing the electrical performance characteristics thereof.

BRIEF SUMMARY OF THE INVENTION

In accordance with the invention, a trench-gated field effect transistor (FET) is formed as follows. Using one mask, a plurality of active gate trenches and at least one gate runner trench are defined and simultaneously formed in a silicon region such that (i) the at least one gate runner trench has a width greater than a width of each of the plurality of active gate trenches, and (ii) the plurality of active gate trenches are contiguous with the at least one gate runner trench.

In one embodiment, a recessed gate electrode is formed in each of the plurality of active gate trenches and a recessed gate runner in the at least one gate runner trench. A dielectric cap is formed over the gate electrode in each of the plurality of active gate trenches and over the gate runner in the gate runner trench using CMP.

In another embodiment, a thick bottom dielectric (TBD) is formed along a bottom portion of the plurality of active gate trenches and the at least one gate runner trench using CMP.

In yet another embodiment, a polysilicon layer is formed filling the plurality of active gate trenches and the gate runner trench and extending over mesa regions adjacent the plurality of active gate trenches. The polysilicon layer is polished until a predesignated CMP stop layer extending over the mesa regions is reached. The polished polysilicon layer is recessed into the plurality of active gate trenches and the at least one gate runner trench to a predetermined depth, thereby forming a recessed gate electrode in each of the plurality of active gate trenches and a recessed gate runner in the gate runner trench.

In accordance with another embodiment of the invention, a trench-gated field effect transistor (FET) is formed as follows. Using a first mask, a plurality of active gate trenches and at least one gate runner trench extending to a first depth within a silicon region are defined and simultaneously formed such that (i) the at least one gate runner trench has a width greater than a width of each of the plurality of active gate trenches, and (ii) the plurality of active gate trenches are contiguous with the at least one gate runner trench. Using the first mask and a second mask for protecting the at least one gate runner trench, only the plurality of active gate trenches are further extended to a second and final depth within the silicon region.

In accordance with yet another embodiment of the invention, a field effect transistor includes a plurality of active gate trenches in a silicon region, each active gate trench including a recessed gate electrode. The FET further includes a gate runner trench in the silicon region, the gate runner trench being contiguous with the plurality of active gate trenches. The gate runner trench includes a recessed gate runner, the recessed gate runner being contiguous with and thus in electrical contact with the recessed gate electrodes. The gate runner trench has a width greater than a width of each of the plurality of active gate trenches.

In accordance with yet another embodiment of the invention, a shielded gate field effect transistor is formed as follows. A plurality of active gate trenches is formed in a silicon region. The lower sidewalls and bottom of the active gate trenches are lined with a shield dielectric. Using a CMP process, a bottom portion of the active gate trenches is filled with a shield electrode comprising polysilicon. An interpoly dielectric (IPD) is formed over the shield electrode in the active gate trenches. Upper sidewalls of the active gate trenches are lined with a gate dielectric. A gate electrode is formed over the IPD in an upper portion of the active gate trenches.

In accordance with yet another embodiment of the invention, a shielded gate field effect transistor is formed as follows. A plurality of active gate trenches is formed in a silicon region. The lower sidewalls and bottom of the active gate trenches are lined with a shield dielectric. A bottom portion of the active gate trenches are filled with a shield electrode comprising polysilicon. Using a CMP process, an interpoly dielectric (IPD) is formed over the shield electrode in the active gate trenches. Upper sidewalls of the active gate trenches are lined with a gate dielectric. A gate electrode is formed over the IPD in an upper portion of the active gate trenches.

In accordance with yet another embodiment of the invention, a shielded gate field effect transistor is formed as follows. A plurality of active gate trenches is formed in a silicon region. Lower sidewalls and bottom of the active gate trenches are lined with a shield dielectric. A bottom portion of the active gate trenches is filled with a shield electrode comprising polysilicon. An interpoly dielectric (IPD) is formed over the shield electrode in the active gate trenches. Upper sidewalls of the active gate trenches and mesa surfaces are adjacent the active gate trenches are lined with a gate dielectric. Using a CMP process, a gate electrode is formed over the IPD in an upper portion of the active gate trenches.

In accordance with yet another embodiment of the invention, a trench-gated field effect transistor (FET) is formed as follows. A plurality of trenches are formed in a silicon region of a first conductivity type. A gate electrode is formed in each trench such that each gate electrode is insulated from the silicon region. A top metal layer is formed using CMP, whereby the top metal layer electrically contacts portions of the silicon regions but is insulated from each gate electrode.

In accordance with yet another embodiment of the invention, a trench-gated field effect transistor (FET) is formed as follows. A plurality of trenches are formed in a silicon region of a first conductivity type. A gate electrode is formed in each trench such that each gate electrode is insulated from the silicon region. A first metal layer having a plurality of portions insulated from one another is formed. At least one of the plurality of portions electrically contacts the silicon region but is insulated from each gate electrode. Using CMP, a second metal layer having a plurality of portions insulated from one another is formed. The second metal layer extends over the first metal layer, wherein one or more portions of the plurality of portions of the second metal layer electrically contact a corresponding one or more portions of the plurality of portions of the first metal layer.

A better understanding of the nature and advantages of the present invention can be gained from the following detailed description and the accompanying drawings.

DETAILED DESCRIPTION OF THE INVENTION

Figure 1A:
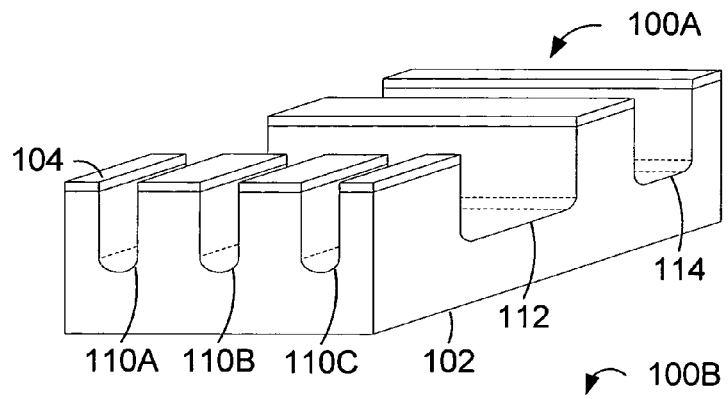
FIGS. 1A to 1D are simplified isometric views of a portion of a trench-gated power device at four stages of fabrication according to an exemplary embodiment of the present invention.

The present invention pertains to improved trench-gated power device structures and processes used to form the same. In one embodiment, fabrication of the trench-gated vertical power MOSFETs includes forming active gate trenches in the active region and gate runner trenches using a single masking/etching process, wherein the gate runner trenches are wider than the active gate trenches. The single masking/etching process includes forming a mask, such as an oxide, nitride, and the like, on the surface of a substrate. The mask includes apertures corresponding to an array of trenches and other structures. Some of the trenches are active gate trenches that are used to form gate structures associated with power MOSFETs. Other trenches are gate runner trenches used to form interconnect structures which electrically connect a plurality of adjacent gate structures or other structures together. Yet other trenches are termination trenches which typically surround the active region, and serve to properly terminate the active region for purposes of maintaining a high breakdown voltage.

In one embodiment, a polysilicon layer is disposed coextensively between the active gate trench and the gate runner trench such that the gate structures and the interconnect structures are electrically connected. At least one chemical mechanical planarization process (CMP) is used to plane the surface of the substrate to a point where the active gate structure, the mesa regions between the trenches, and the interconnect structure are about planar. After the CMP process is finished, the polysilicon in all trenches is recessed to a desired depth. A dielectric layer is deposited on the recessed polysilicon and the mesa regions. Another CMP process is used to remove the dielectric layer from the mesa regions to form individual dielectric layers above the recessed polysilicon in each trench. A metal layer is then deposited on top of the planarized surface of the substrate to electrically connect the mesa surfaces between the trenches together. The dielectric layer in each active gate trench insulates the gates from the metal layer. In one process step, the metal layer is masked or etched such that one part of the metal layer that connects the mesa regions together is electrically separated from another part of the metal layer that connects the gate interconnection structures together.

In using gate runner trench structures rather than the conventional planar gate runner structures, the gate runner inside the gate runner trench needs to be electrically contacted for purposes of bussing the gate runner out to the gate pad. Accordingly, if the width of the gate runner trench is the same as that of the active gate trenches, forming a contact opening over the gate runner trench would be extremely difficult given the photolithography limitations associated with forming a small contact hole over such a narrow trench opening. Thus, it is desirable to form the gate runner trench wider than the active gate trenches. However, forming a wide gate runner trench in the same silicon region where a large number of relatively narrow active gate trenches are formed results in problems with filling the gate runner trench with polysilicon. While conventional polysilicon deposition techniques result in proper filling of the narrower active gate trenches, the same is not the case with wider gate runner trench. Instead, in the gate runner trench the polysilicon merely lines the gate runner trench walls. One approach in addressing this problem has been to use one mask to define and form the active gate trenches and a separate mask to define and form the gate runner trench so that the wide gate runner trench can be made shallower than the active gate trenches and thus easier to fill. But, the two mask technique suffers from misalignment problems along areas where the active gates merge with the gate runners. In accordance with the present invention, a single mask/etching process is used to simultaneously form the active gate trenches and a wider gate runner trench (and optionally termination trenches). A CMP process may then be used such that both the active gate trenches and the wider gate runner trench are filled with polysilicon. This is more clearly illustrated by FIGS. 1A-1D FIGS. 1A to 1D are simplified isometric views of a portion of a trench-gated power device at four stages of fabrication. While FIG. 1A through FIG. 1D illustrate discrete semiconductor structures, it is to be understood however that the structures are only illustrations of some of the structures that may be formed using embodiments of the present invention. Also for illustrative purposes, embodiments of the present invention are described generally in terms of specific fabrication processes used to form trench-gated vertical power MOSFETs having specific layers, substrate materials, etc., however, one skilled in the art will recognize that the present invention may be used in forming many other types of trench-gated power devices. For example, the formation of doped areas using techniques such as ion implantation and diffusion to create the trench-gated vertical power MOSFET's body, source, and heavy body contact regions may be combined with the technique illustrate by FIGS. 1A-1D in numerous combinational sequences, some of which are described below. Some examples of trench-gated vertical power MOSFETs combining both trench formation and junction formation are shown for clarity, however, the various process sequences shown herein often skip steps such as the step of dopant introduction, as such steps are well known to those skilled in the art. As with all other figures described herein, it is to be understood that the relative dimensions and sizes of various elements and components depicted in the figures may not reflect actual dimensions and are for illustrative purposes only.

In FIG. 1A, using a mask 104, silicon region 102 is etched to simultaneously form active gate trenches 110A, 110B, and 110C, gate runner trench 112, and optionally termination trench 114. The single homogenous mask/etching process is advantageous as it prevents the misalignment problems present where multiple masking steps are used to form the various trenches.

Figure 1B:
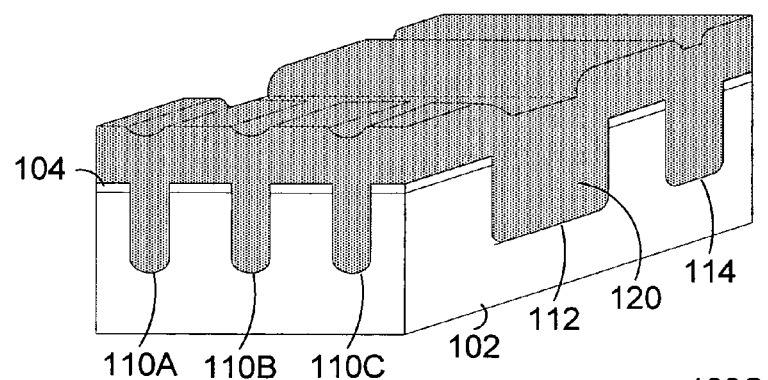
Figure 1C:
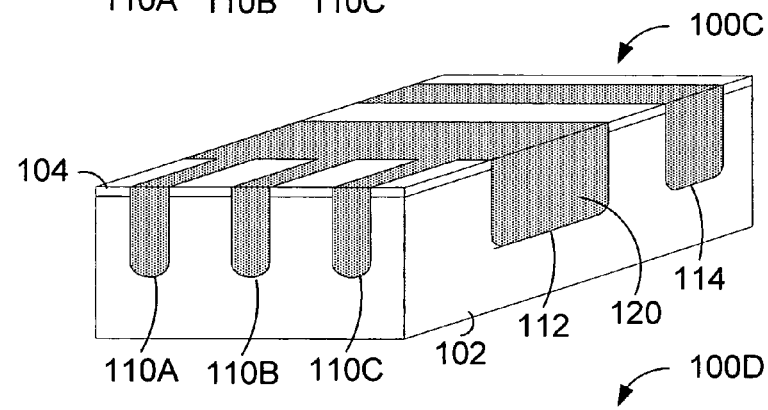
Figure 1D:
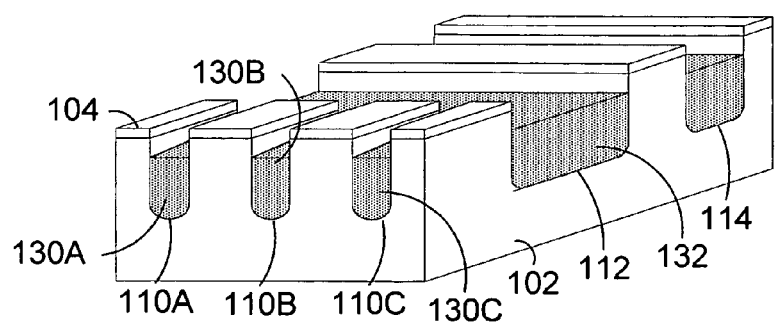

In one embodiment, active gate trenches 110A, 110B, and 110C, gate runner trench 112, and termination trench 114 are lined with an insulation layer (not shown). Active gate trenches 110A, 110B, and 110C are disposed generally perpendicular to gate runner trench 112, but may be disposed in any relative position that may be used to advantage. In FIG. 1B, a polysilicon layer 120 is deposited filling active gate trenches 110A, 110B, and 110C, gate runner trench 112, and termination trench 114, and extending over the mesa regions. FIG. 1C illustrates the planar surface of the structure after the polysilicon layer 120 is etched using a CMP process with mask layer 104 serving as a CMP stop layer. As illustrated, after the CMP process, the surfaces of the mask layer 104 and the polysilicon in active gate trenches 110A-110C, gate runner trench 112, and the termination trench 114 are generally coplanar. FIG. 1D shows the structure after the polysilicon in all trenches is recessed to a predetermined depth.

As described more fully in connection with a few exemplary process flows further below, the CMP technique illustrated by FIGS. 1A-1D may be used to form other layers of the trench structure, such as the thick bottom dielectric (TBD) or the dielectric cap over the gate electrodes. The CMP technique of FIGS. 1A-1D has a number of advantages including improved photo capability by eliminating what is known as "pileup" against topography present in conventional techniques, minimum depth of filed, and improved CD uniformity. A highly planar structure with minimal to no structural variations across the array of numerous trenches is thus obtained. In addition, the planar surface enables use of lower temperatures in such backend process steps as BPSG reflow. Also, the lower backend temperature advantageously enables the use of poly silicide.

As indicated above, FIGS. 1A-1D represent only a limited number of the process steps required to form a trench-gated power device such as a MOSFET or an IGBT. For example, in the case of a MOSFET, conventional process techniques may be combined with those depicted in FIGS. 1A-1D to form the body region in silicon region 102, the source regions and heavy body regions in the body region, the various dielectric layers insulating the polysilicon in all trenches from surrounding silicon region 102 and the overlying metal layers, as well as the top-side source contact layer and bottom-side drain contact layer, as is known in the art.

Figure 2:
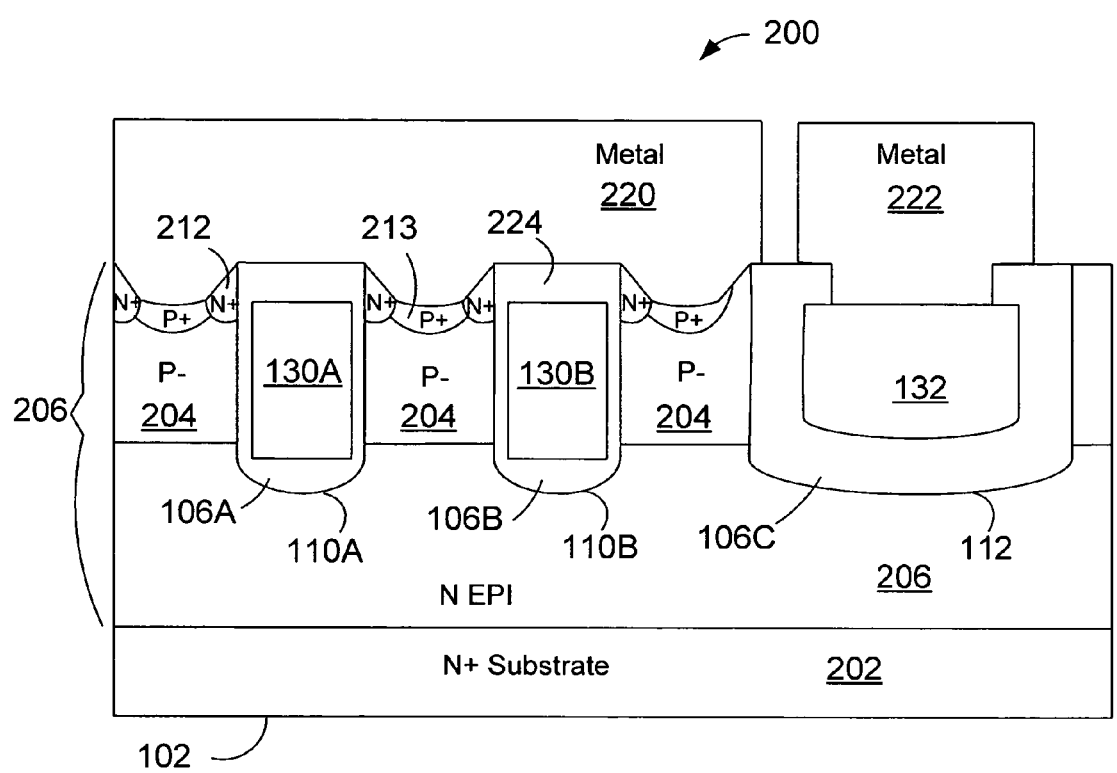
FIG. 2 is a simplified cross-sectional view of a trench-gated vertical power MOSFET structure including a gate runner trench wherein various trenches are formed simultaneously in accordance with an exemplary embodiment of the present invention.

To better understand the various exemplary process flows described herein, the invention will be described in greater detail in the context of a trench-gated vertical power MOSFET 200 of the type shown in FIG. 2, but all portions of the various process flows may be combined with other processes to form other types of power devices as would be known to one skilled in this art. FIG. 2 illustrates a simplified cross-sectional view of a portion of one embodiment of an exemplary n-type trench-gated vertical power MOSFET 200. An epitaxial region 206 is disposed on a heavily doped n-type substrate 202 forming the drain region. Gate electrodes 130A and 130B and a gate runner 132 formed of a conductive material such as polysilicon are disposed inside respective active gate trenches 110A, 110B and gate runner trench 112. The gate runner trench is advantageously made wider than active gate trenches 110A, 110B so that an electrical contact can be made to gate runner 132 inside gate runner trench 112. In one embodiment, a ratio of the width of the gate runner trench to that of the active gate trench is in the range of 2-20.

Active gate trenches 110A and 110B extend through p-type body region 204 and terminate in the drift region of epitaxial layer 206. Since active gate trenches 110A and 110B and gate runner trench 112 are formed using the same masking/etching process described herein, the gate runner trench 112 extends to about the same depth as the active gate trenches 110A and 110B. However, it is understood by one skilled in the art that although active gate trenches 110A, 110B and gate runner trench 112 are formed at the same time using one mask, the gate runner trench may extend slightly deeper or shallower than active gate trenches depending on such factors as the size of openings for the active gate trenches and that gate runner trench, how densely the active gate trenches are formed, as well as the general differences in the etch recipes used in various manufacturing processes.

Active gate trenches 110A, and 110B, and gate runner trench 112 are lined with various insulating layers to electrically insulate gate electrodes 130A and 130B and gate runner 132 from surrounding silicon regions. n-type source regions 212 are formed inside the p-type body region 204 adjacent trenches 110A and 110B usually through doping. The source regions may be formed using a two-pass angled implant of n-type dopants into the recessed mesa regions. The n-type source regions 212 and p-type body region 204 define a current conduction channel vertically aligned along the sidewall of each active gate trench 110A and 110B. Heavy body regions 213 are formed in body region 204 between adjacent source regions 212.

In order to electrically connect all source regions 212 and body regions 204, a metal layer 220 is formed on the surface of the structure. A dielectric layer 224 insulates gate. electrodes 130A and 130B from metal layer 220. Another metal layer 222 is used to electrically contact gate runner 132. While illustrated as being parallel to active gate trenches 110A and 110B, gate runner trench 112 generally extends perpendicular to the active gate trenches 110A and 110B as illustrated in FIG. 1A through FIG. 1D. However, those skilled in the art will appreciate that active gate trenches 110A and 110B and gate runner trench 112 may be positioned in any position relative to one another that may be used to advantage.

The structure of FIG. 2 is repeated many times to form an array of trench-gated vertical power MOSFET 200 with their gate electrodes 130A, 130B interconnected by one or more gate runners 132. Next, a number of process sequences are described which utilize the technique of the present invention to form improved trench-gated structures.

Figure 3A:
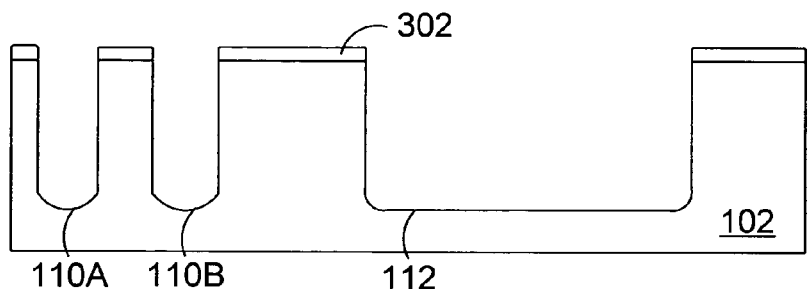
FIGS. 3A to 3J are simplified cross-sectional views illustrating a fabrication process for a trench-gated power device including a gate runner trench, wherein CMP techniques are used according to an exemplary embodiment of the present invention.
Figure 3B:
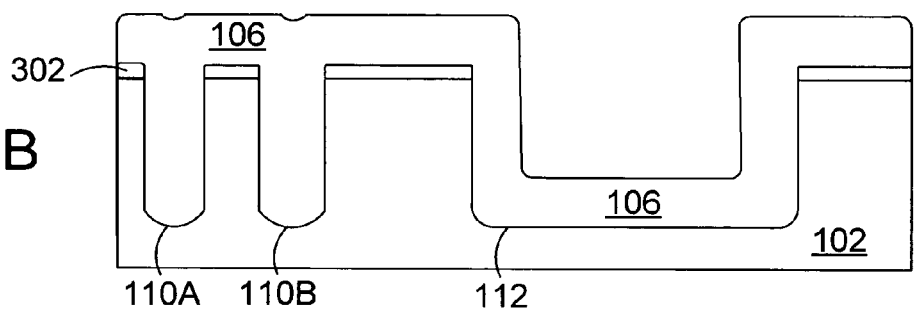

FIGS. 3A to 3J are simplified cross-sectional views illustrating an exemplar fabrication process for forming a planarized trench-gated vertical field effect transistor having a gate runner trench 112. In FIG. 3A, using a mask 302 and conventional silicon etch techniques, active gate trenches 110A and 110B and gate runner trench 112 are etched into a silicon region 102. Mask 302 may be a mask that is selective to silicon etch such as, oxide, nitride, photoresist, or any combination hereof. In FIG. 3B, a dielectric layer 106 (e.g., comprising an oxide layer having a thickness in the range of 1500 Å to 6000 Å) is deposited filling active gate trenches 110A, 110B, extending into gate runner trench 112 and over the mesa regions using conventional techniques such as SACVD.

Figure 3C:
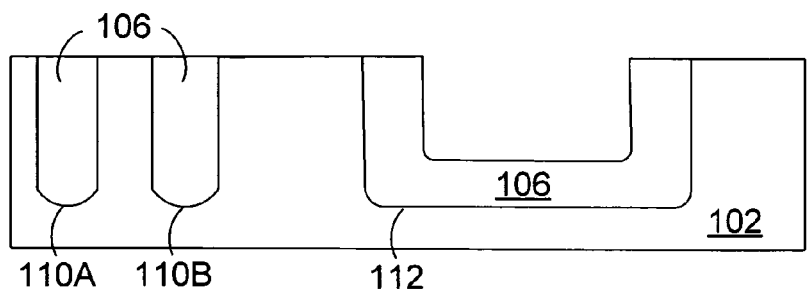
Figure 3D:
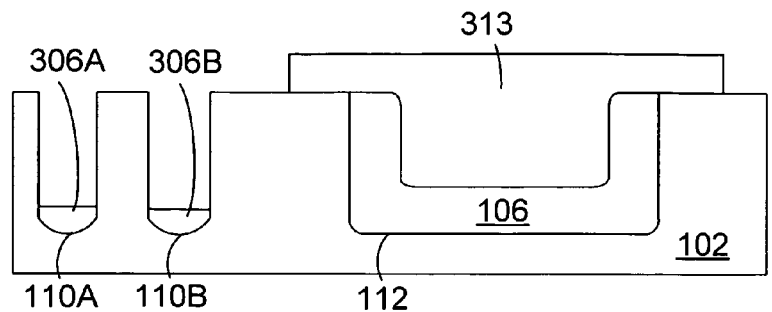

In FIG. 3C, using a CMP process with silicon serving as the CMP stop layer, dielectric layer 106 is polished back with silicon 102 serving as the CMP stop layer. Dielectric 106 is thus removed from all mesa surfaces while active gate trenches 110A and 110B remain filled with dielectric 106. Microloading structures may be used to minimize the extent to which the dielectric layer in gate runner trench 112 is removed during the CMP process. This is discussed in more detail further below in reference to FIG. 8. In FIG. 3D, using a mask 313 to protect dielectric 106 in gate runner trench 112, a conventional dielectric etch is carried out to recess dielectric 106 in active gate trenches 110A, 110B to a predetermined depth, thus forming thick bottom dielectric (TBD) 306A and 306B along the bottom of active gate trenches 110A and 110B, respectively.

Figure 3E:
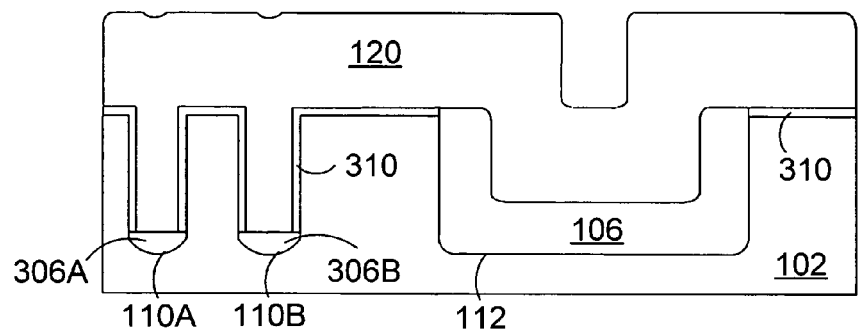

In FIG. 3E, after mask 313 is removed, a gate dielectric layer 310 (e.g., from oxide) is formed along all exposed silicon surfaces by, for example, oxidation of silicon. A polysilicon layer 120 is then formed with optional in-situ doping, filling active gate trenches 110A, 110B and gate runner trench 112, and extending over mesa regions. While FIG. 3E shows gate runner trench 112 being completely filled with polysilicon 120, the invention is not limited as such. Depending on the target width of the gate runner trench and the target thickness of deposited polysilicon 120, gate runner trench 112 may or may not be completely filled with polysilicon. However, if the target thickness of deposited polysilicon 120 is equal to or greater than the depth of the gate runner trench opening, then polysilicon 120 would completely fill trench 112 regardless of the width of trench 112.

Figure 3F:
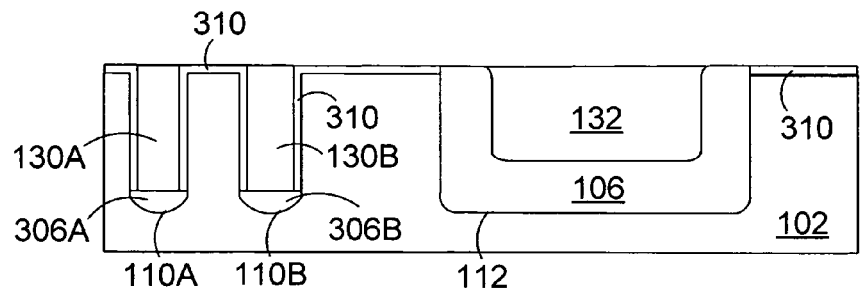
Figure 3G:
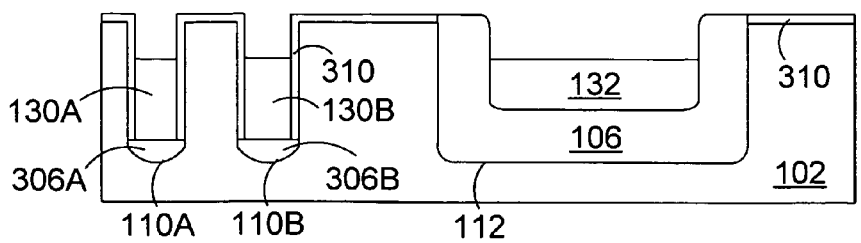

In FIG. 3F, using a CMP process, polysilicon layer 120 is polished back with gate dielectric 310 serving as the stopping layer. Active gate trenches 110A and 110B and gate runner trench 112 thus remain filled with polysilicon while the polysilicon over mesa regions is removed. In FIG. 3G, the polysilicon in all trenches is recessed to a predetermined depth thereby forming gate electrodes 130A, 130B in active gate trenches 110A, 110B, and gate runner 132 in gate runner trench 112. In this etching process, the polysilicon is recessed to a depth less than the target junction depth of the source regions formed in later process stages, so that the source regions overlap the gate electrodes 130A, 130B along the vertical dimension.

Figure 3H:
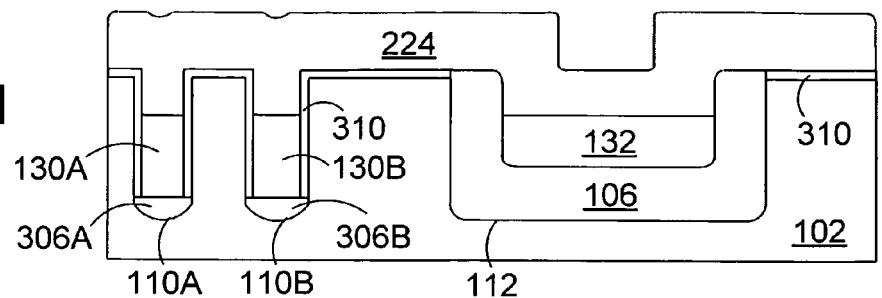
Figure 3I:
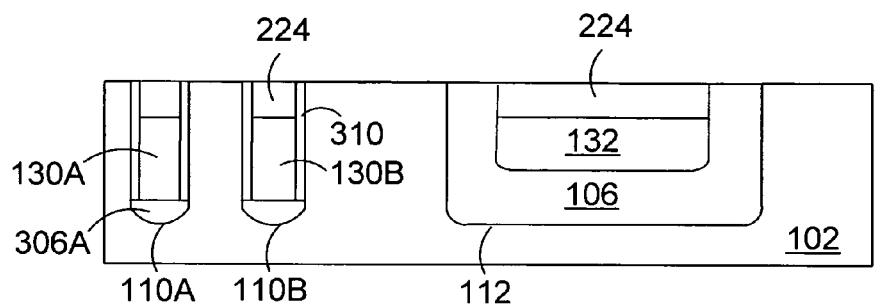

In FIG. 3H, a layer of dielectric or glass 224 such as TEOS (tetraethylorthosilicate), PSG (phosphosilicate glass), BPSG (borophosphosilicate glass), or SOG (spin-on-glass) is formed filling active gate trenches 110A and 110B and gate runner trench 112 and extending over the mesa regions. In FIG. 3I, a CMP process is used to polish back dielectric layer 224 with silicon 102 serving as the CMP stop layer. Upper portions of active gate trenches 110A and 110B and gate runner trench 112 thus remain filled with dielectric 224 while those portions of dielectric 224 as well as gate dielectric 310 extending over the mesa surfaces are removed. Use of CMP at this stage is advantageous as it provides for a highly planer surface to apply a metal layer thereto.

Figure 3J:
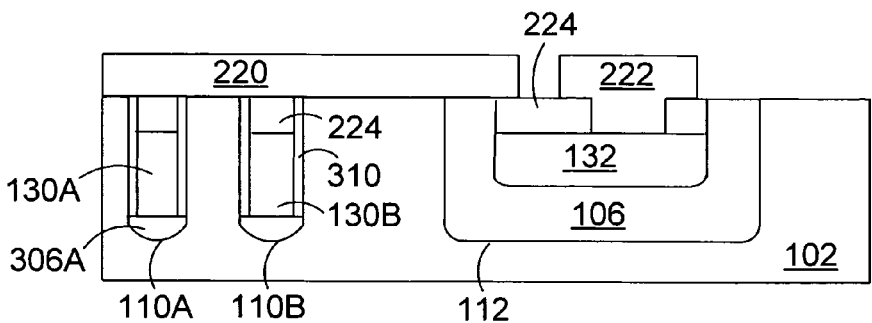

In FIG. 3J, a conventional contact mask/etch process is used to form contact openings in dielectric 224 in gate runner trench and other regions as necessary, followed by conventional metal deposition and patterning to form metal layers 220 and 222. Metal layer 220 connects the mesa surface regions together, and metal layer 222 contacts gate runner 132 through the contact opening previously formed in dielectric layer 224.

The process sequence depicted by FIGS. 3A-3J, or portions thereof, may be used together with other process steps to form various trench-gated power devices including MOSFETs and IGBTs as well as many other trench gated devices described in the above-referenced U.S. patent application Ser. No. 11/026,276. As an example, the following process steps may be incorporated at various stages of the process sequence depicted by FIGS. 3A-3J in order to form an n-channel MOSFET. In this example, silicon region 102 is an n-type epitaxial layer formed over a highly doped n-type substrate similar to that shown in FIG. 2. A p-type body region is formed by, for example, implanting of p-type dopants into the epitaxial layer prior to the steps corresponding to FIG. 3A. Highly doped n-type source regions are formed by performing a two-pass angled implant of n-type dopants into exposed silicon along upper trench sidewalls immediately after the steps corresponding to FIG. 3G. The heavy body regions are formed by first recessing the exposed silicon surfaces and then implanting p-type dopants into the recessed silicon regions, immediately after the steps corresponding to FIG. 3I. The silicon recess is carried out so that the recessed silicon has tapered edges thus leaving portions of the previously formed source regions intact. This method advantageously results in formation of source and heavy body regions which are self-aligned to the active gate trenches.

Figure 4A:
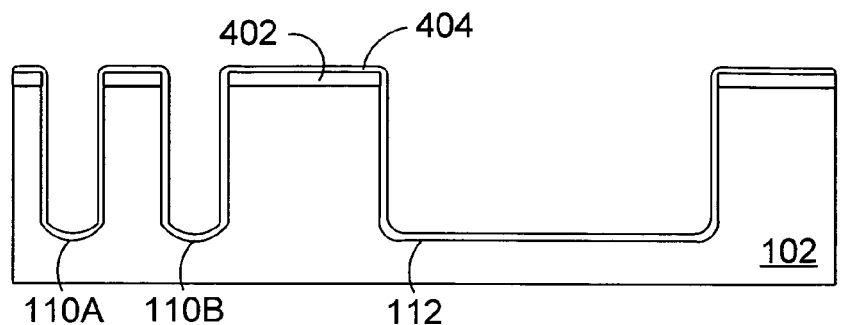
FIGS. 4A to 4J are simplified cross-sectional views illustrating a fabrication process for a trench-gated power device including a gate runner trench, wherein CMP techniques are used according to another exemplary embodiment of the present invention.

FIGS. 4A to 4J are simplified cross-sectional views illustrating another exemplary fabrication process for forming a planarized trench-gated field effect transistor with a gate runner trench. In FIG. 4A, using a mask 402 (e.g., comprising oxide) and conventional silicon etch techniques, active gate trenches 110A and 110B and gate runner trench 112 are etched into silicon region 102. A thin silicon layer 404 (e.g., an epitaxial layer) is formed lining sidewalls and bottom of active gate trenches 110A and 110B and gate runner trench 112, and extending over mask 402.

Figure 4B:
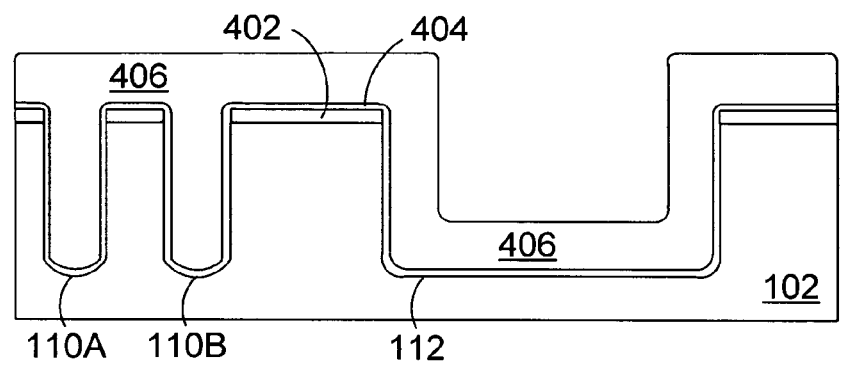
Figure 4C:
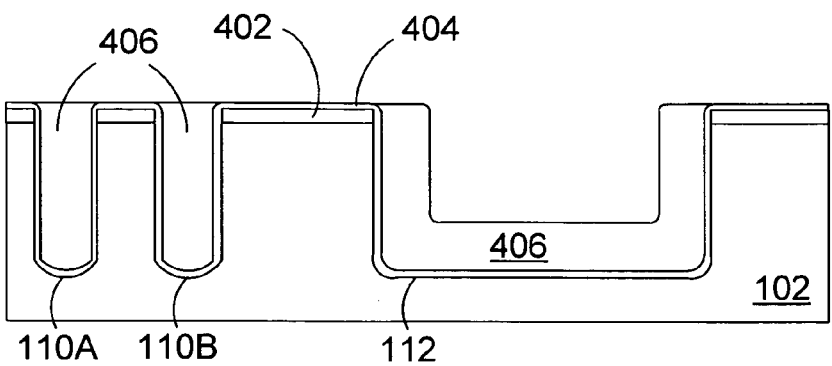

In FIG. 4B, a dielectric layer 406 (e.g., from oxide) of about 1,500 Å to about 6,000 Å is formed which fills active gate trenches 110A and 110B, and extends into gate runner trench 112 and over the mesa regions. In FIG. 4C, a CMP process is used to polish back dielectric layer 406 with silicon layer 404 serving as the CMP stop layer. Dielectric layer 406 thus remains in active gate trenches 110A, 110B and gate runner trench 112 but is removed from over the mesa regions. As in the previous embodiments, microloading structures may be used to minimize the etching of dielectric layer 406 inside gate runner trench 112. Advantageously, silicon layer 404 used as the CMP stop layer preserves mask 402 which is itself later used as a CMP stop layer.

Figure 4D:
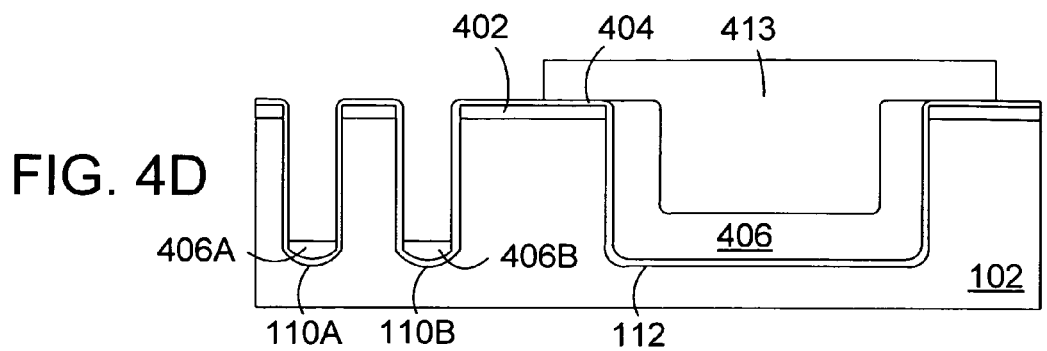
Figure 4E:
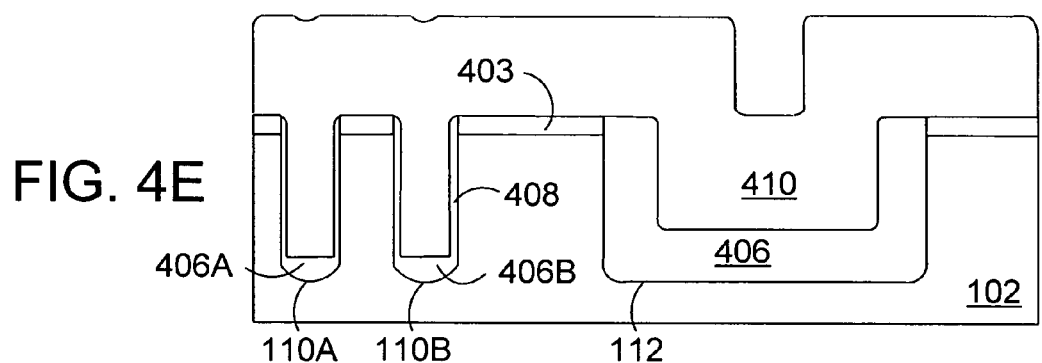

In FIG. 4D, using a mask 413 to protect dielectric 406 in gate runner trench 112, a conventional dielectric etch is carried out to recess dielectric layer 406 in active gate trenches 110A and 110B to a predetermined depth thus forming TBD 406A and 406B along the bottom of the active gate trenches. In FIG. 4E, after mask 413 is removed, a gate dielectric layer 408 is formed (e.g., by oxidation of silicon) along sidewalls of active gate trenches and over mesa surfaces. Gate dielectric layer 408 and mask 402 combine to form a thicker dielectric layer 403 over the mesa surfaces. Depending on the thickness of silicon layer 404 and the process used for forming gate dielectric 408, silicon layer 404 may not be completely consumed by gate dielectric 408. In that case, a silicon etch is necessary to ensure that no part of silicon layer 404 remains over the mesa regions.

A polysilicon layer 410 is then formed filling all trenches and extending over mesa regions. Polysilicon layer 410 may optionally be in-situ doped with phosphorous. While FIG. 4E shows gate runner trench 112 being completely filled with polysilicon 410, the invention is not limited as such. Depending on the target width of the gate runner trench and the target thickness of deposited polysilicon 120, gate runner trench 112 may or may not be completely filled with polysilicon.

Figure 4F:
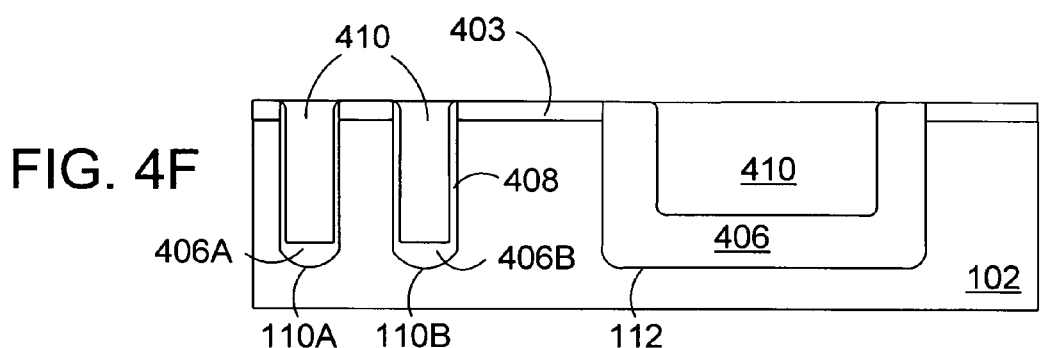
Figure 4G:
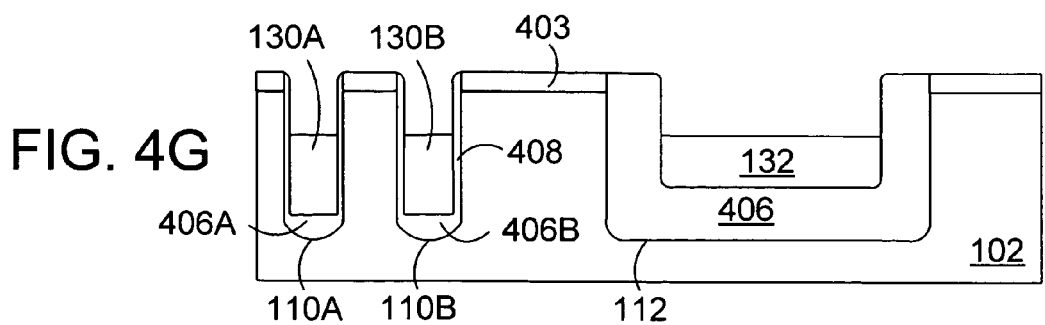

In FIG. 4F, using a CMP process, polysilicon layer 410 is polished back with gate dielectric 403 serving as the CMP stop layer. Active gate trenches 110A and 110B and gate runner trench 112 thus remain filled with polysilicon while the polysilicon over mesa regions is removed. In FIG. 4G, the polysilicon in all trenches is recessed to a predetermined depth thereby forming gate electrodes 130A, 130B in active gate trenches 110A, 110B, and gate runner 132 in gate runner trench 112.

Figure 4H:
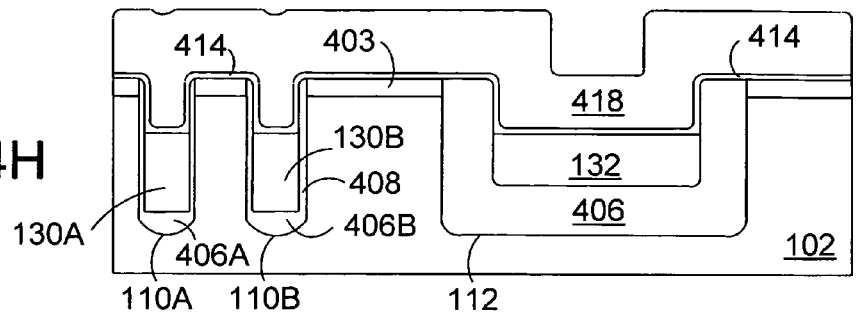
Figure 4I:
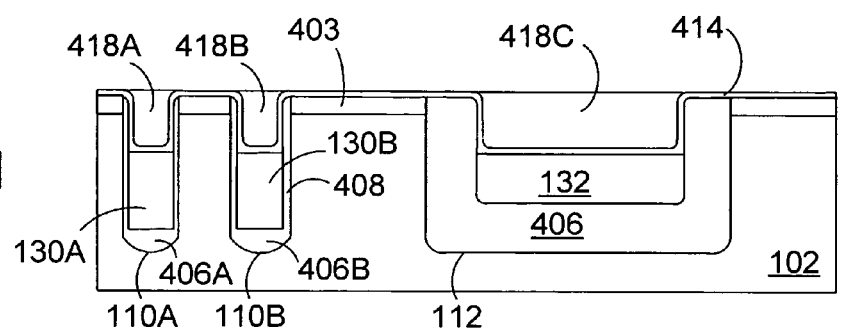

In FIG. 4H, a silicon nitride layer ($Si_3N_4$) 414 is formed extending over the mesa surfaces, gate electrodes 130A and 130B, gate runner 132 and along trench sidewalls. Silicon nitride layer 414 may be deposited using chemical vapor deposition (CVD) to a thickness of about 200 Å to about 1,000 Å. A dielectric layer or glass 418 such as TEOS (tetraethylorthosilicate), PSG (phosphosilicate glass), BPSG (borophosphosilicate glass), or SOG (spin-on-glass) is formed filling active gate trenches 110A and 110B and gate runner trench 112 and extending over the mesa surfaces. In FIG. 4I, a CMP process is carried out to polish back dielectric layer 418 with silicon nitride layer 414 serving as the CMP stop layer. After the CMP process, dielectric portions 418A, 418B, and 418C remain in the respective trenches while those portions of dielectric layer 418 extending over the mesa regions are removed.

Figure 4J:
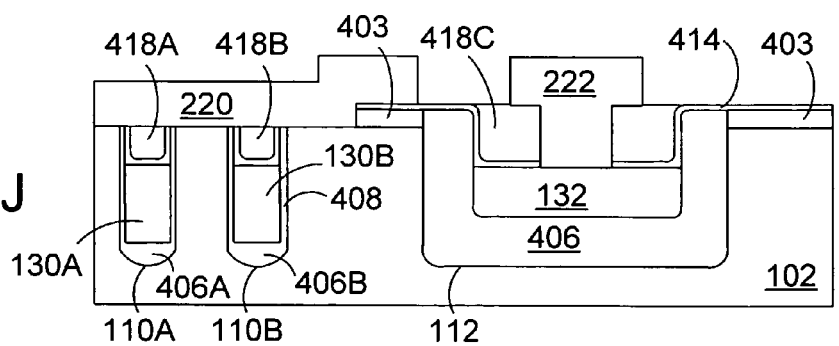

In FIG. 4J, a contact mask is used to form an opening through dielectric layer 418C and to remove silicon nitride 414 and dielectric 403 over mesas adjacent active gate trenches 110A, 110B as well as upper portions of dielectric 418A, 418B in the active gate trenches. A metal contact layer is then deposited and patterned to form a contact layer 220 for electrically connecting the mesa surfaces together and another contact layer 222 for electrically contacting gate runner 132.

FIGS. 5A to 5J are simplified cross-sectional views illustrating another exemplar fabrication process for forming a planarized trench-gated power transistor including a gate runner trench 112. Similar to FIGS. 3A and 4A, using a mask 501, a conventional silicon etch is carried out to form active gate trenches 110A and 110B and gate runner trench 112 in silicon region 102. Mask 501 is a bi-layer of silicon nitride 502 and oxide 504, with silicon nitride 502 being the upper layer.

Figure 5A:
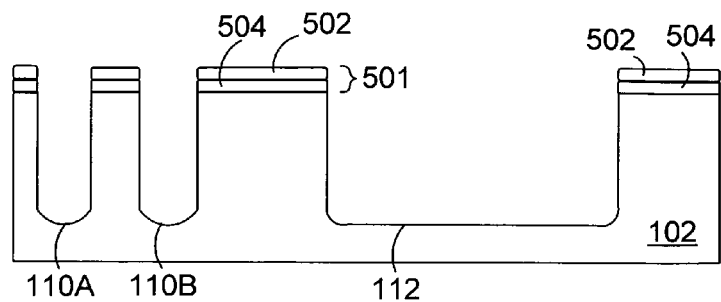
FIGS. 5A to 5J are simplified cross-sectional views illustrating a fabrication process for a trench-gated power device including a gate runner trench, wherein CMP techniques are used according to yet an exemplary embodiment of the present invention.
Figure 5B:
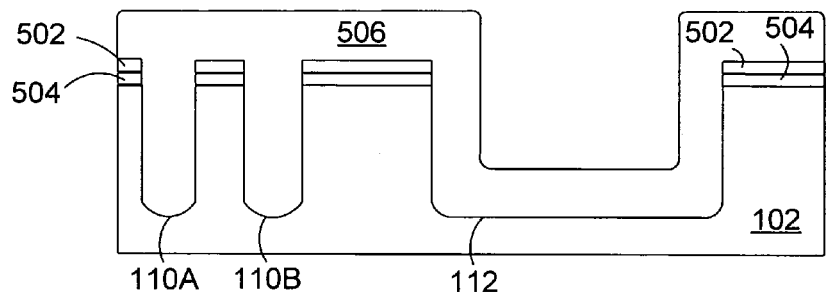
Figure 5C:
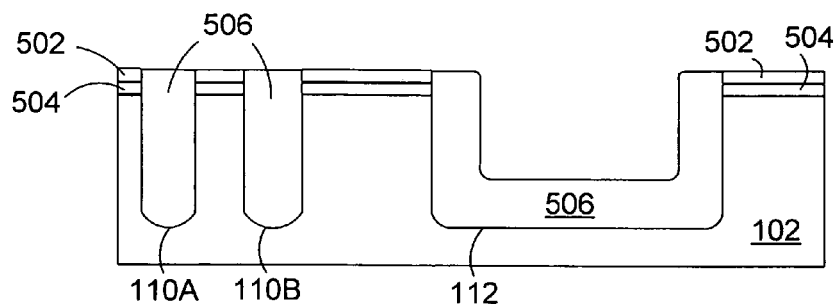

In FIG. 5B, a dielectric layer 506 (e.g., from oxide) of about 1,500 Å to about 6,000 Å is formed which fills active gate trenches 110A and 110B, and extends into gate runner trench 112 and over the mesa regions. In FIG. 5C, a CMP process is used to polish back dielectric layer 406 with nitride layer 502 of mask 501 serving as the CMP stop layer. Dielectric layer 506 thus remains in active gate trenches 110A, 110B and gate runner trench 112 but is removed from over the mesa regions. As in the previous embodiments, microloading structures may be used to minimize the etching of dielectric layer 506 inside gate runner trench 112.

Figure 5D:
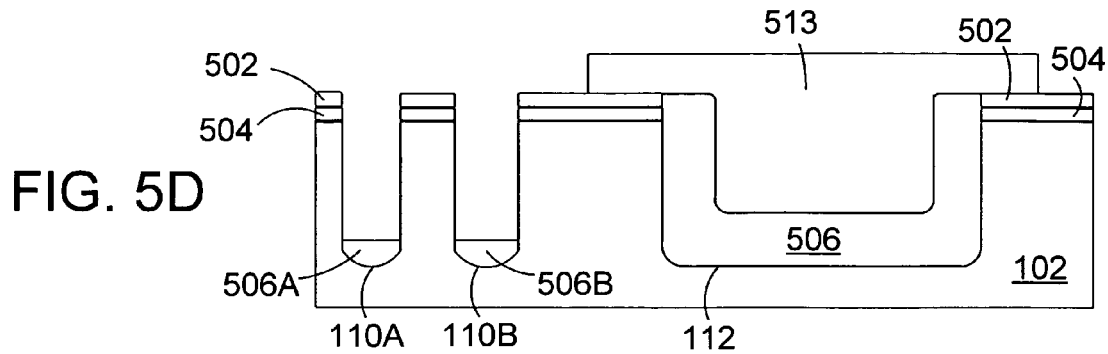
Figure 5E:
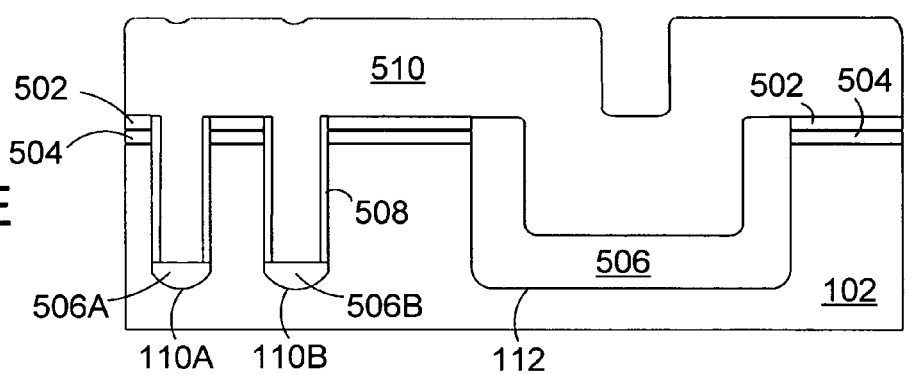

In FIG. 5D, using a mask 513 to protect dielectric 506 in gate runner trench 112, a conventional dielectric etch is carried out to recess dielectric layer 506 in active gate trenches 110A and 110B to a predetermined depth thus forming TBD 506A and 506B along the bottom of the active gate trenches. In FIG. 5E, after mask 513 is removed, a gate dielectric layer 508 is formed (e.g., by oxidation of silicon) along sidewalls of active gate trenches. A polysilicon layer 510 is then formed filling all trenches and extending over mesa regions. While FIG. 5E shows gate runner trench 112 being completely filled with polysilicon 510, the invention is not limited as such. Depending on the target width of the gate runner trench and the target thickness of deposited polysilicon 510, gate runner trench 112 may or may not be completely filled with polysilicon.

Figure 5F:
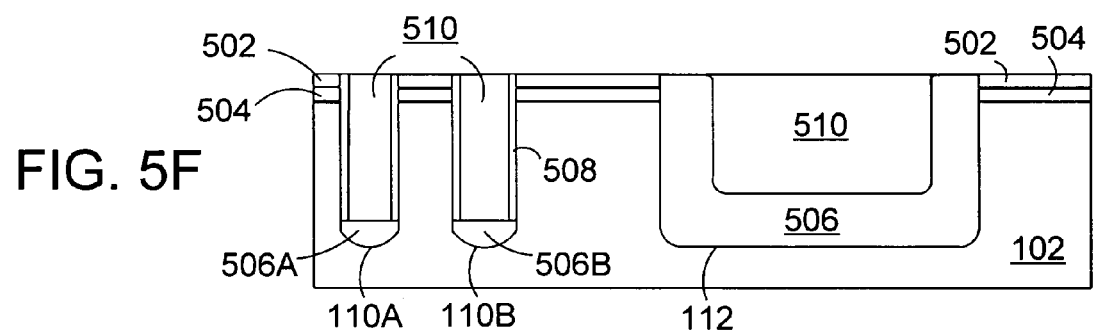
Figure 5G:
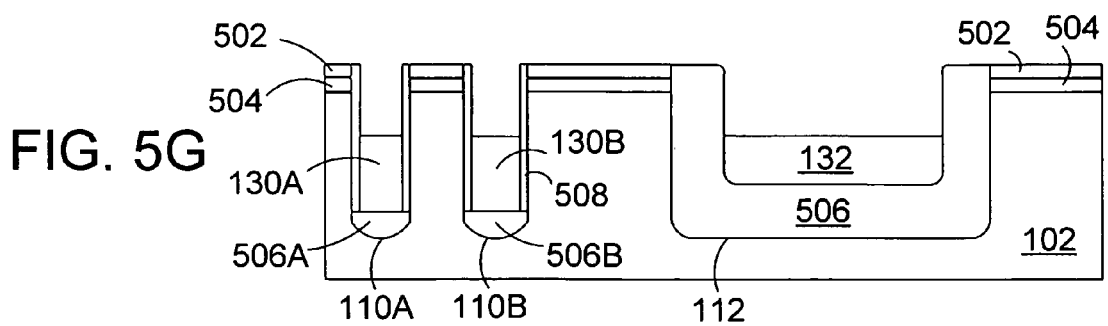

In FIG. 5F, using a CMP process, polysilicon layer 510 is polished back with nitride layer 502 serving as the CMP stop layer. Active gate trenches 110A and 110B and gate runner trench 112 thus remain filled with polysilicon while the polysilicon over mesa regions is removed. In FIG. 5G, the polysilicon in all trenches is recessed to a predetermined depth thereby forming gate electrodes 130A, 130B in active gate trenches 110A, 110B, and gate runner 132 in gate runner trench 112.

Figure 5H:
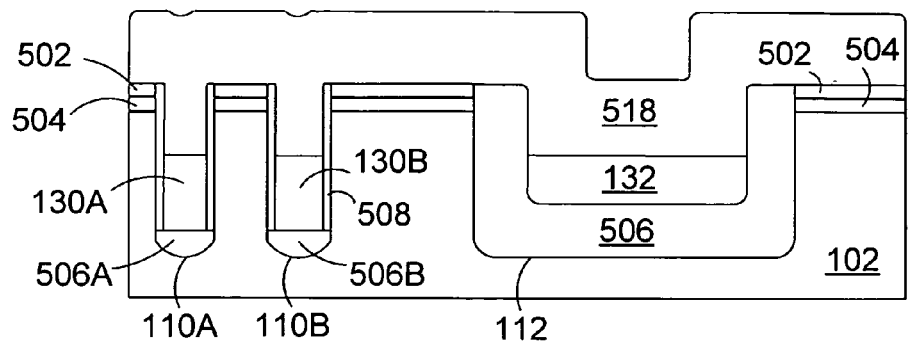
Figure 5I:
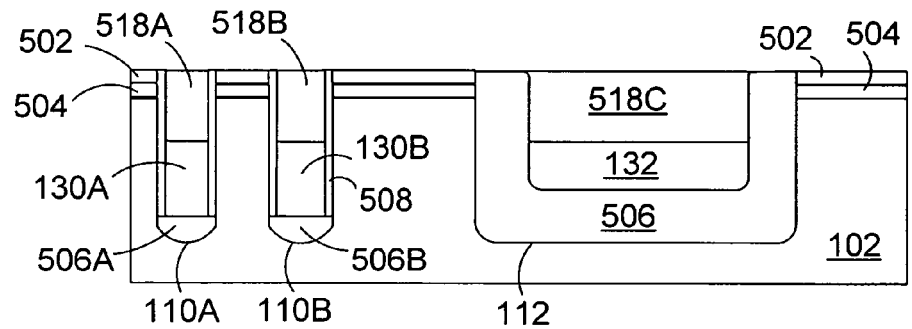

In FIG. 5H, a dielectric layer or glass 518 such as TEOS (tetraethylorthosilicate), PSG (phosphosilicate glass), BPSG (borophosphosilicate glass), or SOG (spin-on-glass) is formed filling active gate trenches 110A and 110B and gate runner trench 112 and extending over the mesa surfaces. In FIG. 5I, a CMP process is carried out to polish back dielectric layer 518 with nitride layer 502 serving as the CMP stop layer. After the CMP process, dielectric portions 518A, 518B, and 518C remain in the respective trenches while those portions of dielectric layer 518 extending over the mesa regions are removed.

Figure 5J:
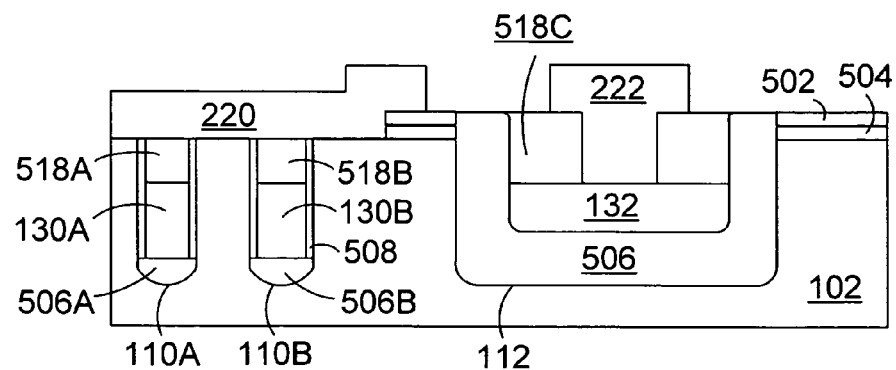

In FIG. 5J, a contact mask is used to form an opening through dielectric layer 518C and to remove nitride layer 502, dielectric layer 504 over mesas adjacent active gate trenches 110A, 110B as well as upper portions of dielectric 518A, 518B in the active gate trenches. A metal contact layer is then deposited and patterned to form a contact layer 220 for electrically connecting the mesa surfaces together and another contact layer 222 for electrically contacting gate runner 132.

Similar to the process sequence depicted by FIGS. 3A-3J, the two process sequences depicted by FIGS. 4A-4J and 5A-5J or portions thereof may be combined with other processes to form various trench-gated power devices. The exemplary process steps for forming the body region, source regions, and heavy body regions described above in connection with the FIGS. 3A-3J embodiment may also be integrated in a similar manner with the process embodiments of FIGS. 4A-4J and 5A-5J to form a MOSFET.

While the process sequences of FIGS. 3A-3J, 4A-4J, and 5A-5J use CMP at three stages of the process, the invention is not limited as such. Following are few exemplary variations of the FIGS. 3A-3J, 4A-4J, and 5A-5J embodiments. In one variation, non-CMP conventional processing techniques are used to form the thick bottom dielectric (TBD) 306A, 306B, 406A, 406B, 506A, and 506B. In another variation, non-CMP conventional process techniques are used to form gate electrodes 130A, 130B, and 132. In yet another variation, non-CMP conventional process techniques are used to form dielectric portions 224, 418A, 418B, 418C, 518A, 518B and 518C.

Figure 6A:
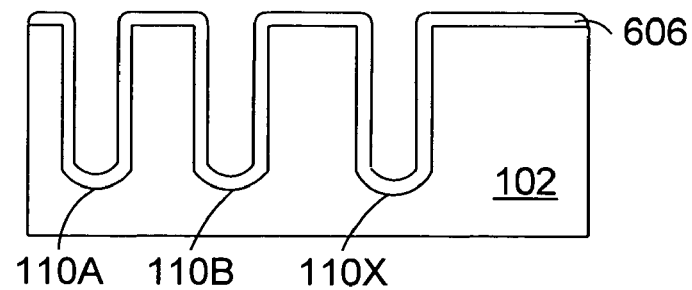
FIGS. 6A to 6J and FIG. 6JJ are simplified cross-sectional views illustrating a fabrication process for a shielded gate trench power device having a trench termination structure, wherein CMP techniques are used according to an exemplary embodiment of the present invention.

FIGS. 6A to 6J are simplified cross-sectional views illustrating a fabrication process for a shielded gate power device in accordance with an embodiment of the invention. FIG. 6A shows a silicon region 102 with active gate trenches 110A and 110B and shield runner trench 110X etched into the silicon region 102 using a single mask/etching process. In one embodiment, a gate runner trench is formed at the same time. A shield dielectric layer 606 is formed in active gate trenches 110A and 110B, in shield runner trench 110X, and over mesa regions. The thickness of shield dielectric 606 is in general greater than that of the later formed gate dielectric (i.e., layer 617 in FIG. 6H), and in one embodiment is in the range of about 500 Å to about 5000 Å depending on the voltage rating of the device. In general, for higher voltage ratings, a thicker dielectric is used than for lower voltage ratings. Also, a thicker shield dielectric 606 serves to reduce the gate to source capacitance. In FIG. 6A, active gate trenches 110A, 110B are shown to be parallel to shield runner trench 110 for illustration purposes only. In an actual device, shield runner trench 110X extends perpendicular to active gate trenches 110A, 110B similarly to the manner in which trench 112 extends perpendicular to active gate trenches 110A, 110B, 110C in FIG. 1A.

In FIG. 6A, shield runner trench 110X is shown as having a similar width as active gate trenches 110A, 110B, however in one embodiment shield runner trench 100X is wider than the active gate trenches. This advantageously eliminates photolithography limitations that would otherwise be present in the later steps when contact openings are formed for a source metal electrically contacting the shield runner electrode. Shield runner trench 100X may be 20%-200% wider than the active gate trenches 110A, 110B. Similarly, in the embodiment with the gate runner trench, the gate runner trench can be formed to be wider than the active gate trenches in order to eliminate photolithography limitations associated with forming a contact opening for a gate metal to contact the polysilicon gate runner inside the gate runner trench.

Figure 6B:
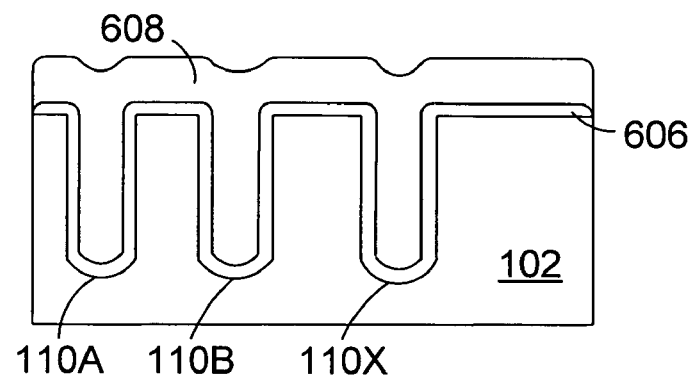
Figure 6C:
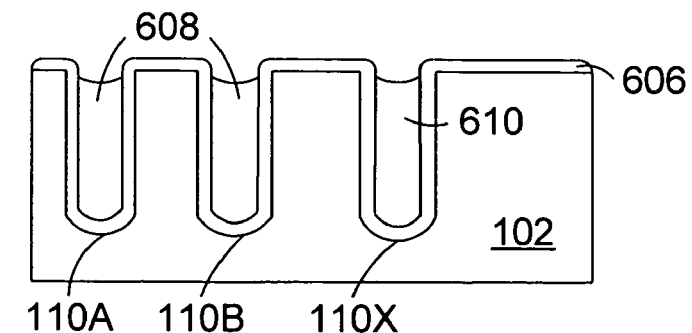

In FIG. 6B, a polysilicon layer 608 is formed which fills the active gate trenches 110A and 110B and the shield runner trench 110X and extends over the mesa regions between the trenches. Polysilicon layer 608 is generally formed thick enough to ensure that active gate trenches 110A and 110B and shield runner trench 110X are filled without unduly increasing a polysilicon CMP process time carried out next. In FIG. 6C, polysilicon layer 608 is polished back with dielectric layer 606 serving as the CMP stop layer. Advantageously, the use of CMP at this process point completely removes the polysilicon from the surface of the substrate 102 to prevent the formation of "stringers" which are pieces of the polysilicon film that may remain after a conventional etching process.

In FIG. 6C, the polysilicon remaining in the three trenches is shown as being slightly recessed. This is to eliminate the localized stress that would be present at the upper corners of shield runner trench 110X if shield runner electrode 610 was not recessed. In one embodiment, the recess is achieved by performing what is known as an intentional dish CMP (i.e., the CMP process is continued for a short period of time after dielectric 606 is exposed). In an alternate embodiment, the CMP is stopped when dielectric 606 is exposed followed by a separate timed etch of the polysilicon to the desired recess depth. The recess depth may be approximately equal to or slightly greater than the thickness of shield dielectric 606.

Figure 6D:
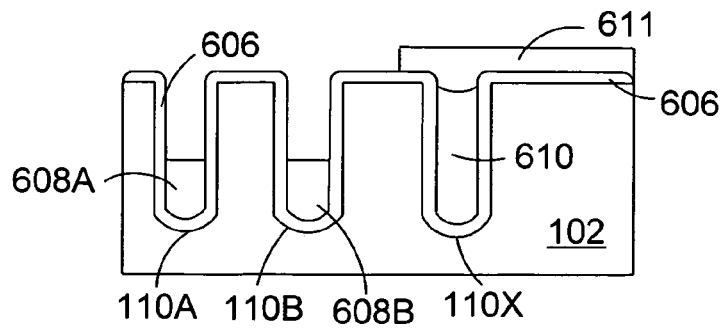

In FIG. 6D, a mask 611 is used to protect the shield runner electrode 610 while a polysilicon etch is carried out to recess the polysilicon in active gate trenches 110A, 110B to a predetermined depth. Shield electrodes 608A and 608B are thus formed in the lower portion of the active trenches. Advantageously, dielectric layer 606 etches at a much slower rate than polysilicon layer 608, allowing a controlled formation of shield electrodes 608A and 608B. A controlled formation of shield electrodes 608A and 608B provides control over electrical characteristics associated with shield electrodes 608A and 608B. For example, shield electrodes 608A and 608B may be sized in thickness to reduce the capacitance between gate electrodes 130A and 130B (FIG. 6J) and the drain region.

Figure 6E:
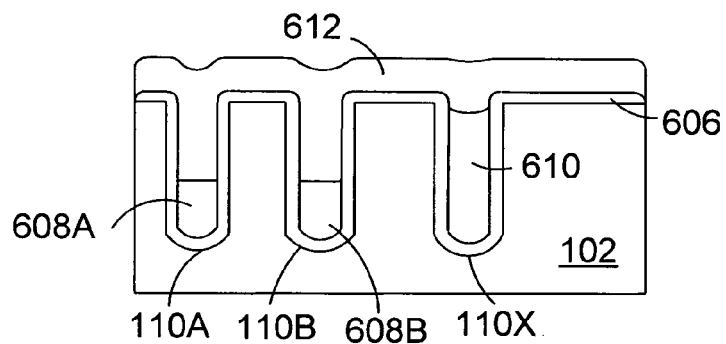
Figure 6F:
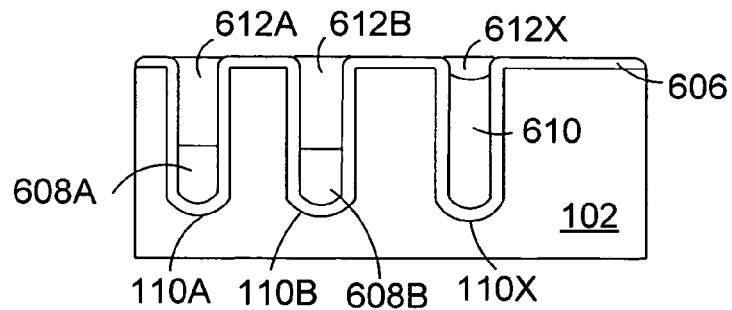

In FIG. 6E, a dielectric layer 612 is formed which fills active gate trenches 110A, 110B, and extends over the mesa regions and the shield runner trench 110X. In FIG. 6F, a CMP process is used to remove dielectric layer 612 from over the mesa regions while the active gate trenches remain filled with dielectric material 612A, 612B and shield runner trench 110X remains filled with dielectric material 612X. In one embodiment, dielectric layer 612 comprises deposited oxide, and dielectric layer 606 comprises thermal oxide serving as a stopping layer for the CMP process. Alternatively, silicon 102 may be used as the stopping layer.

Figure 6G:
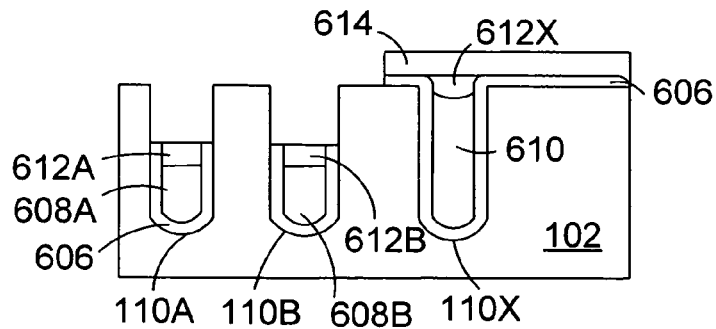

In FIG. 6G, a mask layer 614 protects shield runner trench 110X and its adjacent mesa surfaces while all exposed dielectric is etched back to thereby form inter-polysilicon dielectric layers (IPD) 612A and 612B. IPD layers 612A and 612B serve to insulate shield electrodes 608A, 608B from their respective gate electrodes 130A and 130B formed thereon in later stages. The etching process also removes the dielectric layer 606 from upper sidewalls of active gate trenches 110A and 110B and the adjacent exposed mesa surfaces. The extent to which mask 614 overlaps the mesa surface between shield runner trench and active gate trench 110B must be carefully considered. First, the overlap must allow for sufficient mesa surface so that a proper source contact can later be made to silicon 102 (see contact area marked as 611 in FIG. 6J). Second, mask 614 needs to overlap the mesa region sufficiently so that a thick enough portion of dielectric layer 612 remains along the vertical wall of the shield runner electrode 610 where the active gate trenches intersect with the shield runner trench. This vertically extending portion of dielectric layer 612 serves to insulate shield runner electrode 610 from gate electrodes 130A, 130B at the intersection regions.

The quality, thickness, and methods used to fabricate the IPD layers 612A and 612B affects the electrical characteristic of the shielded gate power device with regard to values such as the drain to gate charge (Qgd), resistance between the drain and source (Rdson), gate to source current (Igss), and the like. In the above-referenced U.S. patent application Ser. No. 11/026,276, these and other factors are considered in the various non-CMP methods for forming an IPD layer and the overlying gate electrodes disclosed therein. One or more of these methods may advantageously be combined with the FIGS. 6A-6J embodiment to form an IPD layer with superior characteristics.

Figure 6H:
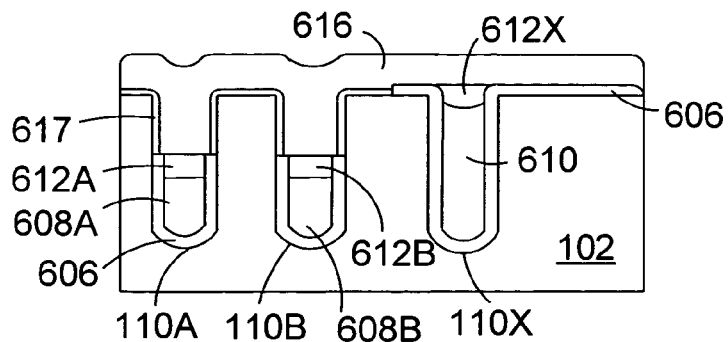
Figure 6I:
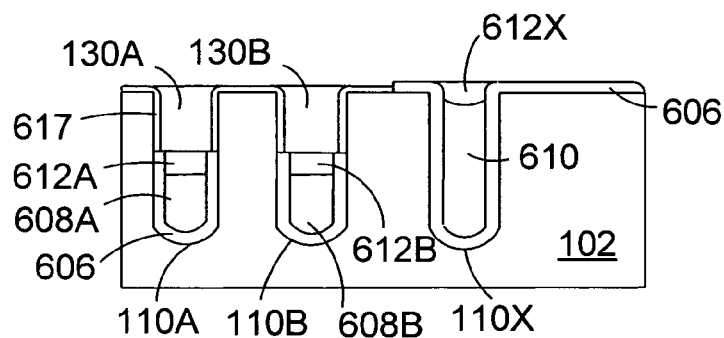

In FIG. 6H, before mask 614 is removed, a gate dielectric layer 617 is formed along exposed sidewalls of active gate trenches 110A and 110B and on the adjacent mesa surfaces using conventional techniques. A polysilicon layer 616 is then formed in active gate trenches 110A and 110B, and on top of shield runner trench 110X and over mesa regions. In FIG. 6I, a CMP process is carried out with dielectric layer 606 serving as the stopping layer, followed by a slight over-etch of the polysilicon to remove polysilicon from the mesa surfaces thus forming gate electrodes 130A and 130B in the active gate trenches. Alternatively, silicon 102 may be used as the stopping layer. In another embodiment, to reduce process cost, polysilicon layer 616 may be etched back using conventional etching techniques thus eliminating a CMP step.

Figure 6J:
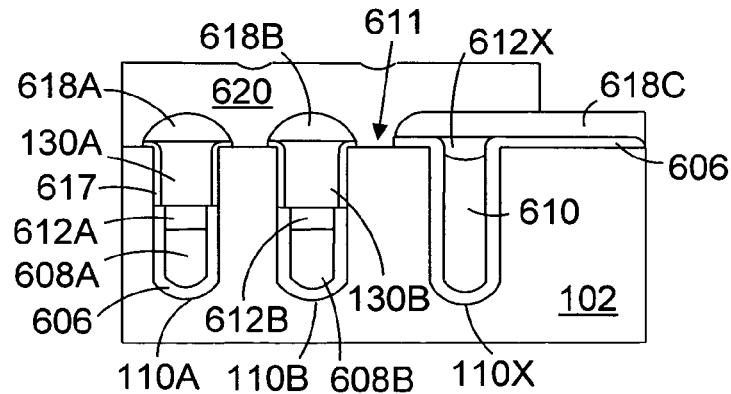
Figure 6J:
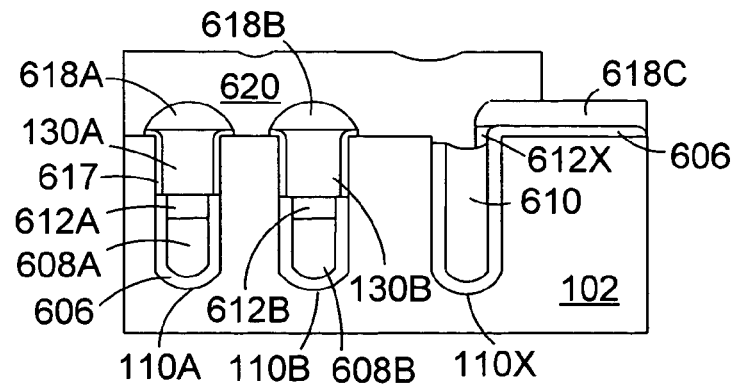

In FIG. 6J, insulating caps 618A and 618B are formed over active gate trenches 110A and 110B, and insulating layer 618C is formed over shield runner trench 110X and its adjacent mesa regions using conventional photolithography and etching techniques. Insulating layer 618A, 618B, 618C may comprise one or more of TEOS, PSG, BPSG, SOG, and the like. A metal contact layer 620 is then formed so as to electrically contact the exposed mesa surfaces. Insulating layer 618A, 618B, 618C insulates metal contact layer 620 from gate electrodes 130A and 130B. In one embodiment, shield runner electrode 610 forms part of a termination structure, and where a body region, source regions and heavy body regions are formed in the mesa regions, shield runner electrode 610 is electrically connected to the source and body regions by metal layer 620 along a third dimension. In an alternate embodiment, shield runner electrode 610 is not connected to any terminals and is thus allowed to float. In yet another embodiment shown in FIG. 6JJ, the photolithography and etching steps associate with forming dielectric caps 618A, 618B and dielectric 618C are carried out such that a portion of dielectric 612X is removed in order to expose a surface region of shield runner electrode 610 as shown. This enables the shield runner electrode 610 to be directly tied to metal layer 620. Also, leaving a portion of dielectric 612X along the upper right corner of shield runner trench 110X helps prevent source to drain leakage in that region. Note that in the FIG. 6JJ embodiment, a wider shield runner trench 110X ensures that proper contact is made between metal layer 620 and shield runner electrode 610.

In the embodiment wherein a gate runner trench is also included in the device, the structure of the gate runner trench and its inner layers would be identical to those in the active gate trenches. That is, the gate runner trench would include a shield dielectric similar to 606, a shield electrode similar to 608A, 608B, an IPD layer similar to 612A, 612B, a gate dielectric layer similar to 617, and a gate electrode similar to 130A, 130B. Using the same processing and masking steps of FIG. 6J, a contact opening can be formed over the gate electrode in the gate runner trench, and a metal layer (insulated from metal layer 620) can then be used to electrically contact the gate electrode in the gate runner trench. Thus, inclusion of the gate runner trench does not require any additional processing steps than those depicted by FIGS. 6A-6J.

In one embodiment, the device is laid out in a modular fashion such that the shield runner trench extends along one side of the die and the gate runner trench extends along an opposite side of the die with the active gate trenches extending in between. In this layout configuration, the shield runner trench and the gate runner trench extend parallel to one another but perpendicular to the active gate trenches. Assuming the shield runner trench extends along the left side of the die and the gate runner trench extends along the right side of the die, the shield electrodes in the active gate trenches would extend from left to right and electrically contact the shield runner electrode 610 along the right side of the die, while the gate electrode in the active gate trenches would extend from right to left and electrically contact the gate electrode in the gate runner trench along the left side of the die.

The process sequence depicted by FIGS. 6A-6J, 6JJ may be used in forming various trench-gated power devices including many of the trench gated structures described in the above-referenced U.S. patent application Ser. No. 11/026, 276. In one embodiment, the exemplary process steps for forming the body region, source regions, and heavy body regions described above in connection with the FIG. 3A-3J embodiment may also be integrated in a similar manner with the process embodiments of FIGS. 6A-6J, 6JJ and its variations to form a shielded gate MOSFET. In an alternate embodiment, these regions are formed as follows. With silicon region 102 being an n-type epitaxial layer formed over a highly doped n-type substrate, after planarization of the polysilicon in FIG. 6I, a p-type body region is formed in the mesa regions by implanting p-type dopants into the epitaxial layer. Using a masking/implant process, n-type source regions are formed in the body region adjacent each active gate trench. After formation of dielectric caps 618A, 618B (FIG. 6J) but before forming the metal layer 618B, heavy body regions are formed in the body region by implanting p-type dopants into the exposed surfaces of the body region.

While the method of FIGS. 6A-6J embodiment uses CMP at three stages of the process, the invention is not limited as such. Following are few exemplary variations of the FIGS. 6A-6J embodiment. In one variation, non-CMP conventional masking and etching process is used to form the gate electrodes 130A, 130B. This enables implementation of termination structures using the gate electrodes. In another variation, non-CMP conventional techniques or techniques described in the above-referenced U.S. patent application Ser. No. 11/026,276 are used to form the IPD layer and the gate electrodes. In yet another variation, any one of non-CMP conventional techniques or techniques described in the above-referenced U.S. patent application Ser. No. 11/026,276 is used to form the shield electrode 608A, 608B.

In all the above embodiments, a single mask/etching step is used to simultaneously form the active gate trenches and the gate runner trenches and/or the shield runner trench in order to eliminate misalignment problems in the transition region from the active gate trench to gate runner trench present in conventional multi-mask/etching steps. However, in accordance with another embodiment of the invention illustrated by FIGS. 7A and 7B, two mask/etching steps are carried out in forming the active gate trenches and the gate runner trench and/or the shield runner trench such that no misalignment problems are present in the transition regions.

Figure 7A:
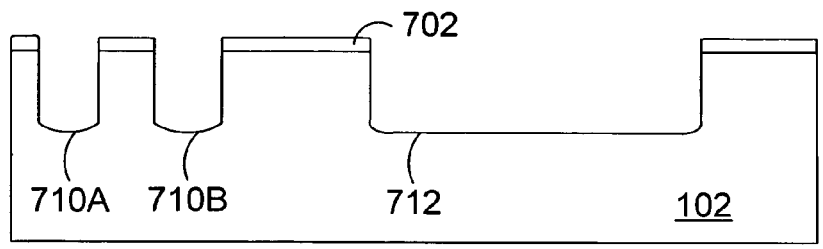
FIGS. 7A and 7B are simplified cross-sectional views illustrating process steps for a trench-gated power device including a gate runner trench, wherein various trenches are formed using multiple masking/etching steps in accordance with an exemplary embodiment of the present invention.
Figure 7B:
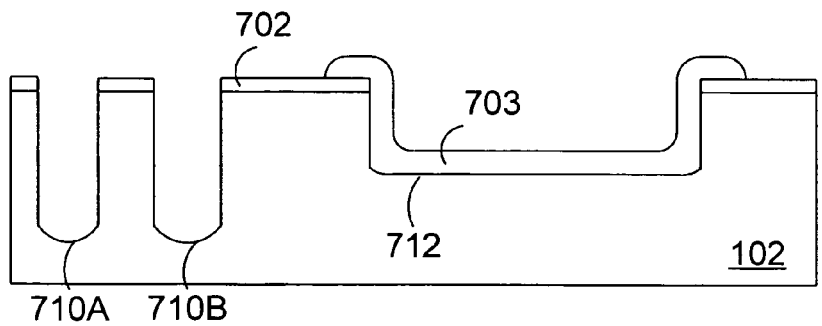

In FIG. 7A, a first mask 702 is used to define openings for the active gate trenches and the gate runner trenches (as well as the shield runner/termination trenches if desired). A first silicon etch is then carried out to etch the silicon through the openings in the first mask 702, thus forming active gate trenches 710A, 710B that extend to the same depth as the gate runner (or shield runner) trench 712. In FIG. 7B, a second mask 703 is used to cover the gate runner trench 712 (and/or the shield runner/termination trenches), and a second silicon etch is performed to extend active gate trenches 710A, 710B to their final target depth. This embodiment is particularly useful in devices where active gate trenches need to extend deeper than normal, as in higher voltage devices or the shielded gate structures such as that shown in FIGS. 6A-6J. Keeping the gate runner trenches shallow requires thinner films when filling the gate runner trenches. The thinner films in turn require shorter etch and/or CMP processes. In the process sequences shown in FIGS. 3A-3J, 4A-4J, 5A-5J, and 6A-6J and their variations, the steps corresponding to FIGS. 3A, 4A, 5A, and 6A may be replaced with the two mask/etching steps depicted in FIGS. 7A-7B.

In all the various process sequences described herein, the top metal layer is formed using conventional techniques. However, in one embodiment, a CMP process is used to form a highly planar top metal layer. This is advantageous in applications where flip chip packaging or solderable device technology is used. Variations of the process sequence of FIGS. 4A-4J will be used to describe two techniques for forming a planar top metal, however all other process sequences described herein and their obvious variations could be modified to integrate either of the two techniques in a similar manner.

Figure 8A:
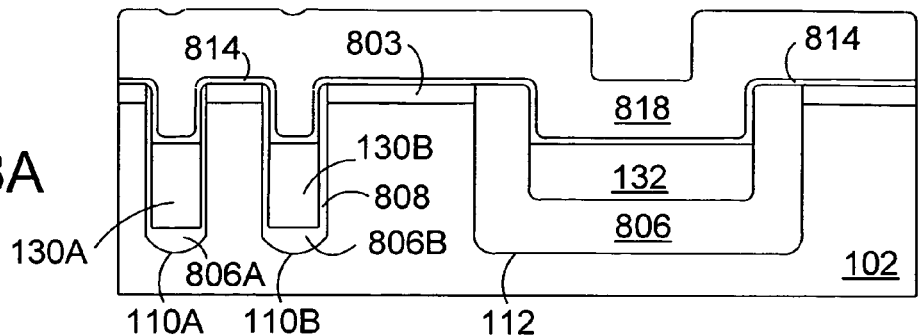
FIGS. 8A to 8D, 9A to 9D and 10A to 10C are simplified cross-sectional views illustrating process steps for forming the top layer metal using CMP techniques in accordance with three exemplary embodiments of the present invention.
Figure 8B:
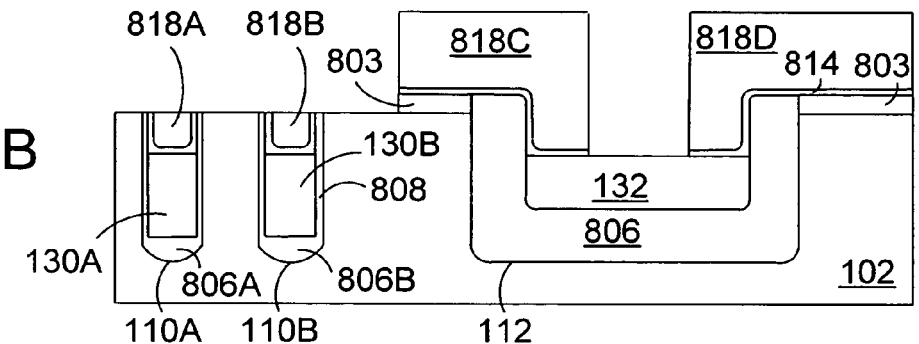

The first technique will be described using the process steps depicted by FIGS. 8A-8D which replace the process steps corresponding to FIGS. 4H to 4J in the process sequence of FIGS. 4A-4J. In FIG. 8A, dielectric layer 818 is a composite layer comprising a nitride or oxynitride layer overlying a layer of BPSG, and the underlying dielectric layer 414 comprises low temperature oxide (LTO). In an alternate embodiment, composite layer 818 includes a layer of polyimide formed either on top of or instead of the top nitride or oxynitride layer. In FIG. 8B, conventional photolithography and etch steps are carried out to pattern and etch dielectric layer 818 and its underlying dielectric layers 814 and 803 until silicon is reached, thereby forming contact openings as shown.

Figure 8C:
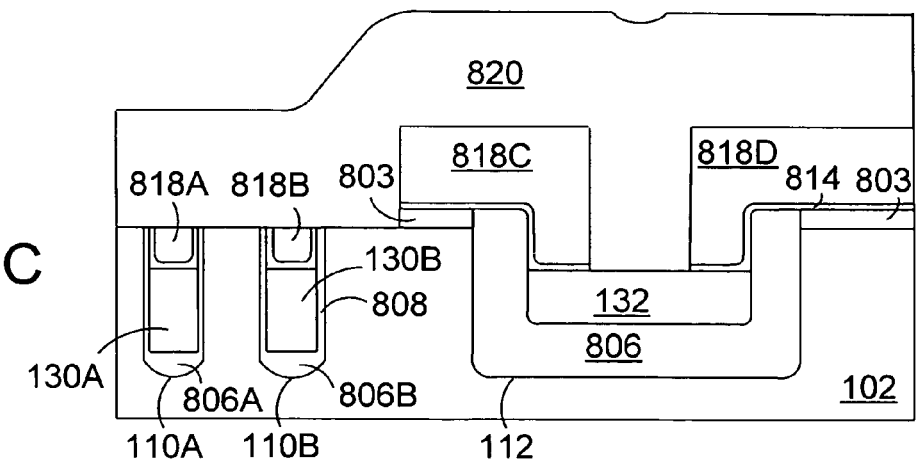
Figure 8D:
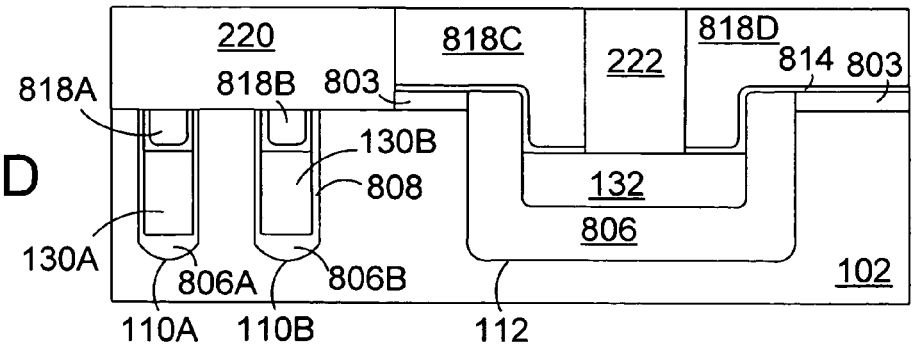

In FIGS. 8C and 8D, a metal layer 820 is deposited and then polished back with dielectric layer 818C, 818D serving as the CMP stop layer. Source metal layer 220 and gate runner metal 222 insulated from one another by dielectric layer 818C are thus formed such that a substantially planar surface is obtained. In one embodiment, metal layer 220, 222 comprises copper and an underlying layer of barrier metal such as tantalum or tantalum nitride in order to prevent copper migration. In another embodiment, metal layer 220, 222 comprises aluminum and an underlying barrier metal such as titanium, titanium nitride, or cobalt in order to reduce the metal to silicon contact resistance.

Figure 9A:
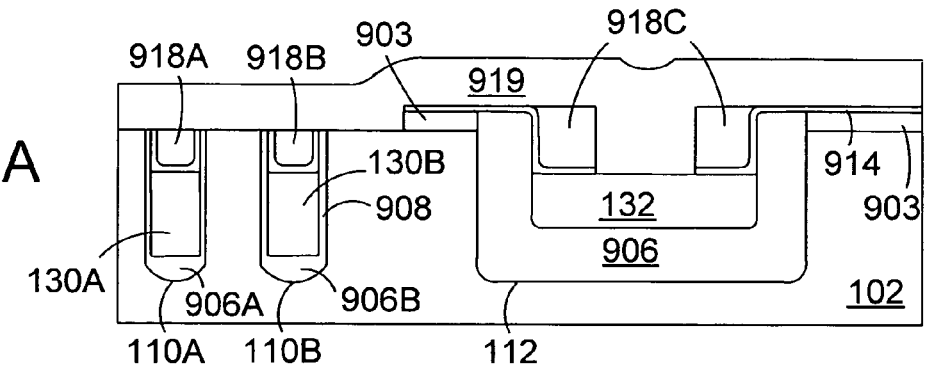
Figure 9B:
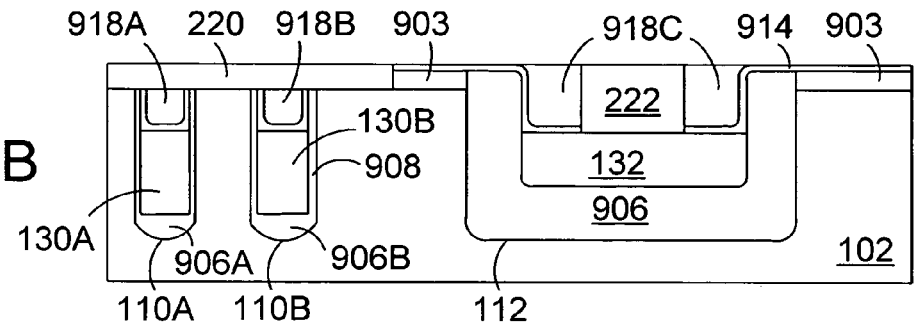

The second technique involves forming two metal layers, and will be described using the process steps depicted by FIGS. 9A-9D which replace the process steps corresponding to FIG. 4J in the process sequence of FIGS. 4A-4J. Upon completion of the process steps corresponding to FIG. 4I, the process steps corresponding to FIG. 9A are carried out. In FIG. 9A, conventional photolithography and etching steps are carried out to pattern and etch dielectric layers 918, 914, and 903 until silicon is reached, thereby forming contact openings as shown. A first metal layer 919 is then deposited filling the contact openings and extending over the remaining dielectric portions. In FIG. 9B, using CMP, the first metal layer 919 is polished back with dielectric layer 914 serving as the CMP stop layer. A first layer 220 of the source metal contact layer and a first layer 222 of the gate runner metal contact layer are thus formed in a substantially planar manner. Metal layers 220 and 222 are relatively thin (e.g., about 5000-20,000 Å thick).

Figure 9C:
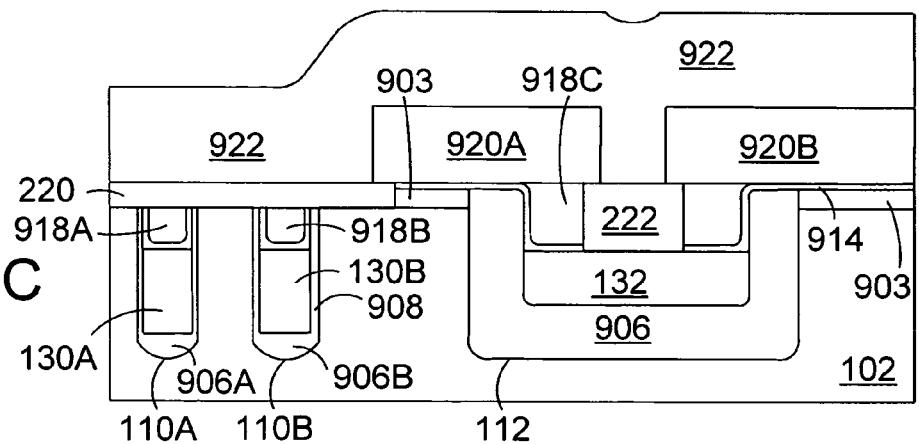
Figure 9D:
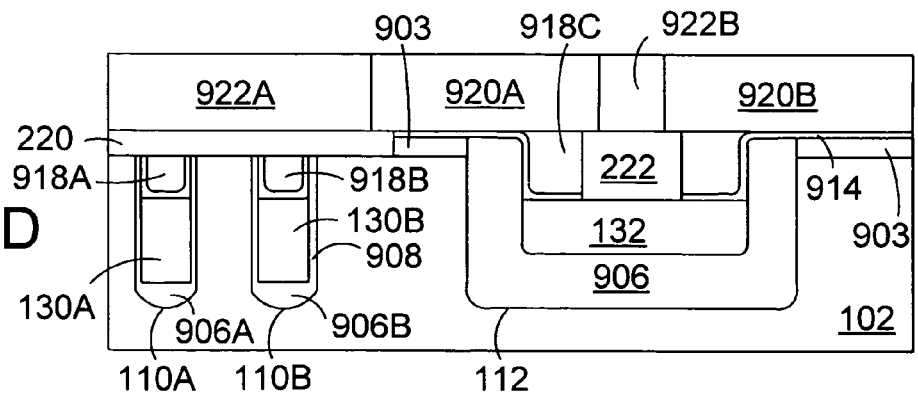

In FIG. 9C, a dielectric layer 920 comprising nitride or oxynitride is formed and then patterned and etched using conventional photolithography and etching steps to thereby form contact openings in dielectric layer 920 as shown. A second metal layer 922 is then deposited filling the contact openings formed by dielectric portions 920A, 920B. In FIG. 9D, using CMP, the second metal layer 922 is polished back with dielectric layer 920A, 920B serving as the CMP stop layer. The source metal contact layer comprising two metal layers 220 and 922A, and the gate runner metal contact layer comprising two metal layers 222 and 922B are thus formed in a highly planar manner as illustrated in FIG. 9D. In one embodiment, metal layer 922 comprises copper and an underlying layer of barrier metal such as tantalum or tantalum nitride in order to prevent copper migration. In another embodiment, metal layer 922 comprises aluminum and an underlying barrier metal such as titanium, titanium nitride, or cobalt in order to reduce the metal to silicon contact resistance.

Figure 10A:
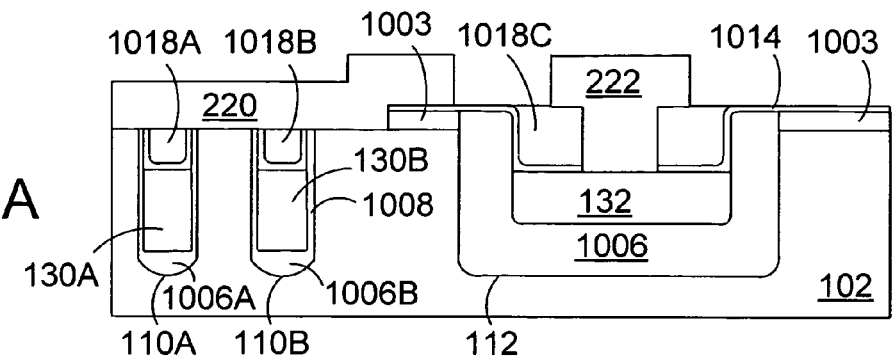
Figure 10B:
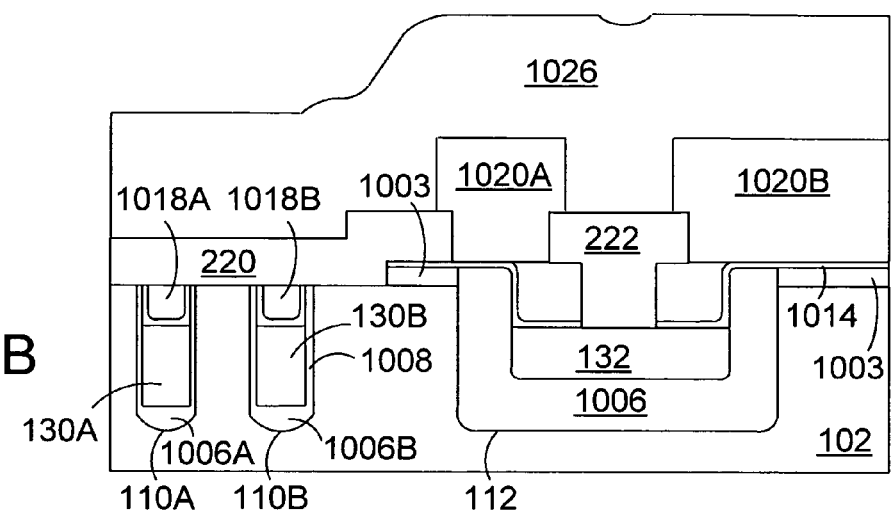
Figure 10C:
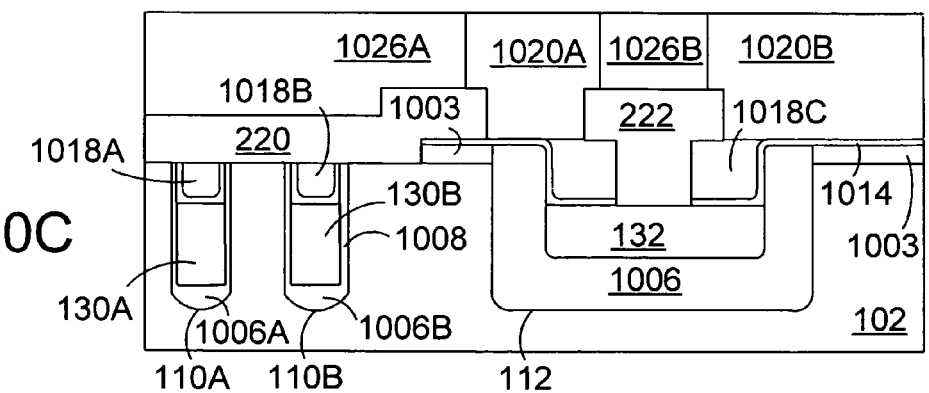

In the process sequence of FIGS. 9A-9D, both metal layers are formed using CMP. In an alternate embodiment shown in FIGS. 10A to 10C, only the upper metal layer is formed using CMP, as described next. FIGS. 10A-10C replace the process steps corresponding to FIG. 4J in the process sequence of FIGS. 4A-4J. FIG. 10A corresponds to FIG. 4J, and a first metal layer 220 of the source contact layer and a first metal layer 222 of the gate runner contact layer are formed in a similar manner to metal layer portions 220 and 222 in FIG. 4J. In FIG. 10B, a dielectric layer 1020 comprising nitride or oxynitride is formed and then patterned and etched using conventional photolithography and etching steps to thereby form contact openings in dielectric layer 1020 as shown. A second metal layer 1026 is then deposited filling the contact openings formed by dielectric portions 1020A, 1020B.

In FIG. 10C, using CMP, the second metal layer 1026 is polished back with dielectric layer 1020A, 1020B serving as the CMP stop layer. The source metal contact layer comprising two metal layers 220 and 1026A, and the gate runner metal contact layer comprising two metal layers 222 and 1026B are thus formed in a planar manner as illustrated in FIG. 10C. In one embodiment, metal layer 1026 comprises copper and an underlying layer of barrier metal such as tantalum or tantalum nitride in order to prevent copper migration. In another embodiment, metal layer 1026 comprises aluminum and an underlying barrier metal such as titanium, titanium nitride, or cobalt in order to reduce the metal to silicon contact resistance.

Figure 11:
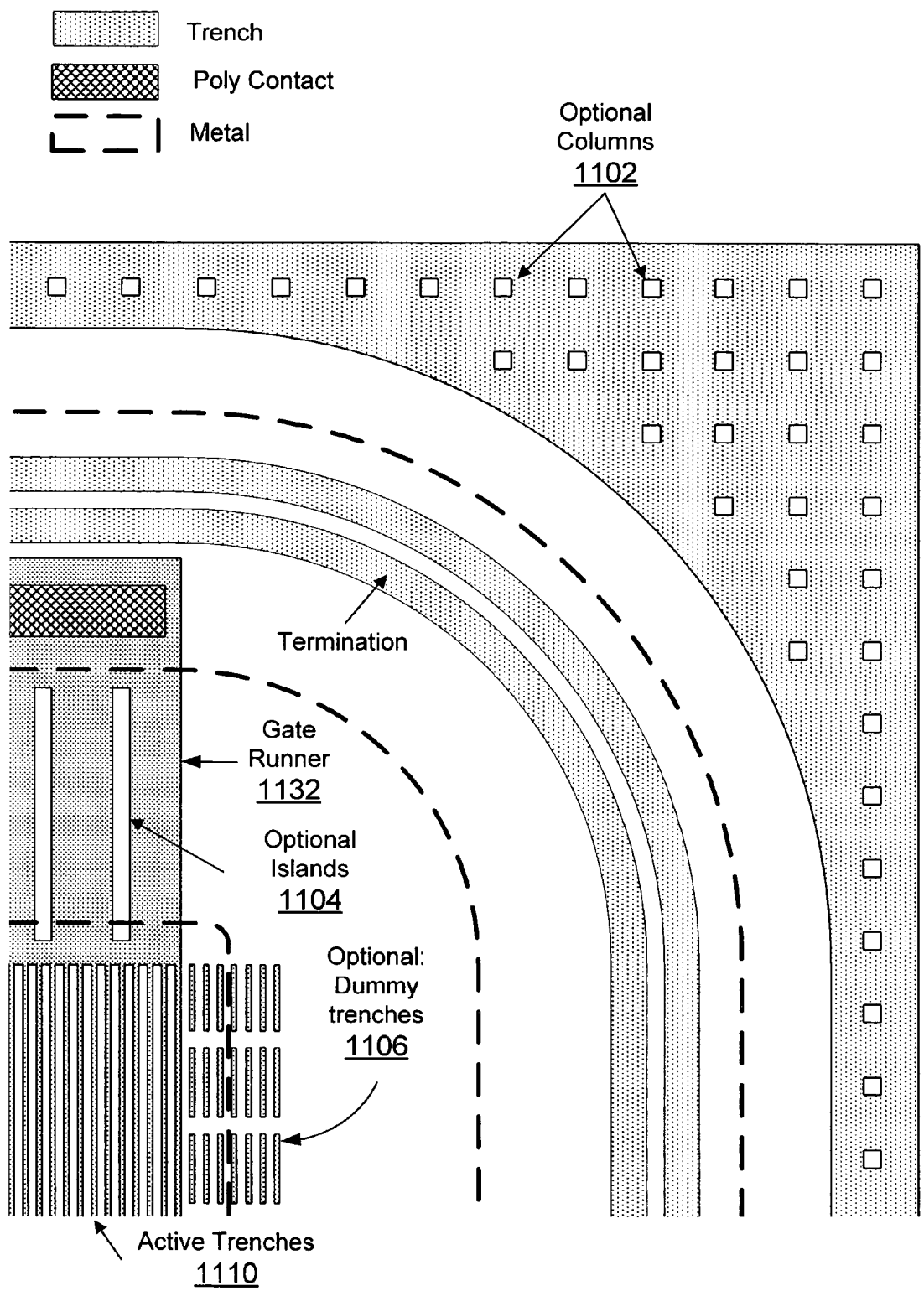
FIG. 11 shows a top view of a portion of a die illustrating an array of a trench-gated power device and CMP loading structures according to an exemplary embodiment of the present invention.

FIG. 11 is a simplified top view of a portion of a die illustrating an array of trench-gated vertical power MOSFETs and CMP microloading structures 1102, 1104 and optional dummy trenches 1106 (e.g., trenches that are not used for active devices) located on a substrate. During a CMP process, a corrosive chemical slurry, often referred to as a colloid, is used in conjunction with a rotating polishing pad (not shown) sized larger in diameter than the wafer being processed to planarize the surface of the wafer. Generally, the polishing pad tends to flex somewhat during the process with respect to the topography. As the wafer surface often has numerous mesas and trenches, larger trench areas between mesa regions often allow the polishing pad to flex. The flex in the polishing pad causes the polishing pad to polish some surfaces more than others which leads to variations in the topography of the wafer surface. The variation in topography causes variations in device fabrication and therefore variations in device performance. In one embodiment, as illustrated in FIG. 11, a plurality of optional CMP microloading structures 1102 (silicon pillars) are disposed in trench areas, islands of silicon 1104 are disposed within gate runner 1132, and dummy trenches (e.g., inactive gate trenches) 1106 are disposed on the wafer to help spread the polishing force across the surface of the substrate being planarized. Therefore, in accordance with the present invention, microloading structures 1102, islands 1104, and dummy trenches 1106 provide the CMP rotating surfaces a more uniform surface profile, improving the accuracy of the CMP processes.

In an alternate embodiment, the outer trench area with microloading structures 1102 is modified as follows. Rather than a wide trench, a plurality of trenches are formed each having a pitch equal to or less than (e.g., by a factor of three) that of the active gate trench. The plurality of trenches may extend vertically or horizontally, may be curved, or may be any combination thereof. Such microloading structure prevents formation of what is commonly know as "silicon grass" (i.e., thin silicon pillars) in wide trenches when narrow and wide trenches are formed at the same time. If not properly addressed, silicon grass can cause leakage or other process/device related failures. Further, while in FIG. 11 islands 1104 are formed at intervals of every 5 active gate trenches, the spacing between adjacent islands 1104 may be reduced to, for example, intervals of every 2-3 active gate trenches.

In the exemplary process sequences described herein, CMP is used to form various layers in the trenches. While full detail of the CMP processes are not provided, such CMP techniques and processes are well known in the art. Any modifications to known CMP techniques as necessitated by the particular structures and/or process sequences described herein would be obvious to one skilled in this art in view of this disclosure.

The various embodiments of the invention described above, in particular the technique for forming the active gate trenches and the gate runner trench, may advantageously be combined with the various power devices and process technologies described in greater detail in the above-referenced commonly assigned U.S. patent application Ser. No. 11/026,276.

While the above provides a detailed description of various embodiments of the invention, many alternatives, modifications, and equivalents are possible. For example, many of the integrated formation techniques described herein in the context of a MOSFET, in particular a trench gated MOSFET, may be used for other types of process technologies to manufacture semiconductor structures. Furthermore, it is to be understood that all numerical examples and material types provided herein to describe various dimensions, energy levels, doping concentrations, and different semiconducting or insulating layers are for illustrative purposes only. Moreover, one or more of the various dielectric layers in the embodiments described herein may comprise low-k or high-k dielectric material. For example, one or more of the dielectric layers formed before the first polysilicon deposition may comprise high-k dielectric material, while one or more of the dielectric layers formed after the last polysilicon deposition may comprise low-k dielectric material. For this and other reasons, therefore, the above description should not be taken as limiting the scope of the invention, which is defined by the appended claims.

What is claimed is:

1. A method of forming a trench-gated field effect transistor (FET), comprising:
using one mask, defining and simultaneously forming a plurality of active gate trenches and at least one gate runner trench in a silicon region such that (i) the at least one gate runner trench has a width greater than a width of each of the plurality of active gate trenches, and (ii) the plurality of active gate trenches are contiguous with the at least one gate runner trench.

2. The method of claim 1 further comprising:
forming a recessed layer inside the plurality of active gate trenches and inside the at least one gate runner trench using CMP.

3. The method of claim 2 wherein the recessed layer is a thick bottom dielectric (TBD) formed along a bottom portion of the plurality of active gate trenches and the gate runner trench.

4. The method of claim 2 wherein the recessed layer is a polysilicon layer forming a gate electrode in each of the plurality of active gate trenches and a gate runner in the gate runner trench, wherein the gate electrode and the gate runner are contiguous.

5. The method of claim 2 further comprising:
forming a CMP stop layer prior to the defining and simultaneously forming step;
forming a first layer filling the plurality of active gate trenches and extending over mesa regions adjacent the plurality of active gate trenches; and
polishing back the first layer until the CMP stop layer over the mesa regions is reached;
recessing the polished back first layer into the plurality of active gate trenches to a predetermined depth.

6. The method of claim 5 wherein the recessed layer is a polysilicon layer and the CMP stop layer is a non-conducting layer.

7. The method of claim 1 further comprising:
forming a recessed gate electrode in each of the plurality of active gate trenches and a recessed gate runner in the at least one gate runner trench; and
forming a dielectric cap over the gate electrode in each of the plurality of active gate trenches and over the gate runner in the gate runner trench using CMP.

8. The method of claim 7 further comprising:
after the step of forming a recessed gate electrode, forming a first dielectric layer filling the plurality of active gate trenches and the gate runner trench and extending over mesa regions adjacent the plurality of active gate trenches; and
polishing back the first dielectric layer until a predesignated CMP stop layer is reached, thereby forming the dielectric cap over each gate electrode and the gate runner.

9. The method of claim 8 wherein the predesignated CMP stop layer is the silicon region.

10. The method of claim 8 wherein the predesignated CMP stop layer is a nitride layer formed prior to the step of the forming a first dielectric layer.

11. The method of claim 8 further comprising:
forming a contact opening in the dielectric cap over the recessed gate runner; and
forming an interconnect layer contacting the gate runner through the contact opening.

12. The method of claim 1 wherein the plurality of active gate trenches extend perpendicularly to the at least one gate runner trench.

13. The method of claim 1 wherein the one mask is used to form at least one termination trench in a termination region of the silicon region simultaneously with the plurality of active gate trenches and the at least one gate runner trench.

14. The method of claim 1 further comprising:
forming a thick bottom dielectric (TBD) along a bottom portion of the plurality of active gate trenches and the at least one gate runner trench using CMP.

15. The method of claim 14 wherein the TBD forming step comprises:
forming a dielectric layer filling the plurality of active gate trenches and extending into the gate runner trench and over mesa regions adjacent the plurality of active gate trenches;
polishing back the dielectric layer until a predesignated CMP stop layer extending over the mesa regions is reached; and
recessing the polished back dielectric layer only into the plurality of active gate trenches to a predetermined depth.

16. The method of claim 15 wherein the predesignated CMP stop layer is the silicon region.

17. The method of claim 15 wherein the predesignated CMP stop layer is a silicon layer formed after the defining and simultaneously forming step.

18. The method of claim 15 wherein the predesignated CMP stop layer is a nitride layer in the one mask.

19. The method of claim 1 further comprising:
forming a polysilicon layer filling the plurality of active gate trenches and the gate runner trench and extending over mesa regions adjacent the plurality of active gate trenches;
polishing back the polysilicon layer until a predesignated CMP stop layer extending over the mesa regions is reached; and
recessing the polished back polysilicon layer into the plurality of active gate trenches and the at least one gate runner trench to a predetermined depth, thereby forming a recessed gate electrode in each of the plurality of active gate trenches and a recessed gate runner in the gate runner trench.

20. The method of claim 19 wherein the predesignated CMP stop layer is a non-conducting layer formed prior to the step of forming a polysilicon layer.

21. The method of claim 20 wherein the non-conducting layer is a gate dielectric.

22. The method of claim 20 wherein the non-conducting layer is a combination of a gate dielectric and the one mask.

23. The method of claim 20 wherein the non-conducting layer is a nitride layer in the one mask.

24. The method of claim 19 further comprising:
prior to the polysilicon layer forming step, forming a thick bottom dielectric (TBD) along a bottom portion of the plurality of active gate trenches and the at least one gate runner trench using CMP.

25. The method of claim 24 wherein the TBD forming step comprises:
forming a first dielectric layer filling the plurality of active gate trenches and extending into the gate runner trench and over mesa regions adjacent the plurality of active gate trenches;
polishing back the first dielectric layer until a predesignated CMP stop layer extending over the mesa regions is reached; and
recessing the polished back first dielectric layer only into the plurality of active gate trenches to a predetermined depth.

26. The method of claim 25 wherein the predesignated CMP stop layer in the step of polishing back the first dielectric layer is the silicon region.

27. The method of claim 25 wherein the predesignated CMP stop layer in the step of polishing back the first dielectric layer is a silicon layer formed after the defining and simultaneously forming step.

28. The method of claim 25 wherein the predesignated CMP stop layer in the step of polishing back the first dielectric layer is a nitride layer in the one mask.

29. The method of claim 25 further comprising:
after the step of recessing the polished back polysilicon layer, forming a second dielectric layer filling the plurality of active gate trenches and the gate runner trench and extending over mesa regions adjacent the plurality of active gate trenches; and polishing back the second dielectric layer until a predesignated CMP stop layer is reached, thereby forming a dielectric cap over each of the recessed gate electrodes and the recessed gate runner.

30. The method of claim 29 wherein the predesignated CMP stop layer in the step of forming a second dielectric layer is the silicon region.

31. The method of claim 29 wherein the predesignated CMP stop layer in the step of forming a second dielectric layer is a nitride layer.

32. The method of claim 31 wherein the one mask comprises the nitride layer.

33. The method of claim 29 further comprising:
forming a contact opening in the dielectric cap over the recessed gate runner; and
forming an interconnect layer contacting the gate runner through the contact opening.

34. The method of claim 19 further comprising:
after the step of recessing the polished back polysilicon layer, forming a dielectric layer filling the plurality of active gate trenches and the gate runner trench and extending over mesa regions adjacent the plurality of active gate trenches; and polishing back the dielectric layer until a predesignated CMP stop layer is reached, thereby forming a dielectric cap over each of the recessed gate electrodes and the recessed gate runner.

35. The method of claim 34 wherein the predesignated CMP stop layer in the step of forming a dielectric layer is the silicon region.

36. The method of claim 34 wherein the predesignated CMP stop layer in the step of forming a dielectric layer is a nitride layer.

37. The method of claim 36 wherein the one mask comprises the nitride layer.

38. The method of claim 34 further comprising:
forming a contact opening in the dielectric cap over the recessed gate runner; and
forming an interconnect layer contacting the gate runner through the contact opening.

39. The method of claim 19 wherein the silicon region has a first conductivity type, the method further comprising:
forming a well region of a second conductivity type in the silicon region;
forming source regions of the first conductivity type in the well region; and
forming a first metal layer electrically contacting the well region and the source regions, and a second metal layer contacting the recessed gate runner.

* * * * *

UNITED STATES PATENT AND TRADEMARK OFFICE
CERTIFICATE OF CORRECTION

PATENT NO. : 7,449,354 B2 Page 1 of 1
APPLICATION NO. : 11/327657
DATED : November 11, 2008
INVENTOR(S) : Marchant It is certified that error appears in the above-identified patent and that said Letters Patent is hereby corrected as shown below:

On the Title Page, item [75]: please correct the Title and Inventors sections as follows:

(12) change "Marchant et al."
    to    --Marchant--.

(54) and column 1, line 1:
    change    "TRENCH-GATED FET FOR POWER DEVICE WITH ACTIVE GATE TRENCHES AND GATE RUNNER TRENCH UTILIZING ONE-MASK ETCH"
    to    --POWER DEVICE UTILIZING CHEMICAL MECHANICAL PLANARIZATION--.

Col. 6, line 39, change "filed" to --field--.

Col. 12, line 6, change "trench 110" to --trench 110X--.

Col. 15, line 63, change "layer 414" to --layer 814--.

Signed and Sealed this

Fifth Day of January, 2010

David J. Kappos
*Director of the United States Patent and Trademark Office*